United States Patent
Ono et al.

(10) Patent No.: US 7,109,494 B2
(45) Date of Patent: Sep. 19, 2006

(54) DEFLECTOR, METHOD OF MANUFACTURING DEFLECTOR, AND CHARGED PARTICLE BEAM EXPOSURE APPARATUS USING DEFLECTOR

(75) Inventors: Haruhito Ono, Kanagawa (JP); Masatake Akaike, Kanagawa (JP); Kenji Tamamori, Kanagawa (JP); Futoshi Hirose, Kanagawa (JP); Yasushi Koyama, Kanagawa (JP); Atsunori Terasaki, Tokyo (JP); Ken-ichi Nagae, Kanagawa (JP); Yoshinori Nakayama, Tokyo (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 283 days.

(21) Appl. No.: 10/787,082

(22) Filed: Feb. 27, 2004

(65) Prior Publication Data
US 2004/0169147 A1 Sep. 2, 2004

(30) Foreign Application Priority Data
Feb. 28, 2003 (JP) ........... 2003-053102
Feb. 5, 2004 (JP) ........... 2004-029602

(51) Int. Cl.
*H01J 37/47* (2006.01)
*H01J 37/30* (2006.01)

(52) U.S. Cl. .............. 250/396 R; 250/492.22; 250/492.2; 250/492.23; 250/398; 250/347

(58) Field of Classification Search ........... 250/492.22, 250/396 R, 492.2, 492.3, 398, 341
See application file for complete search history.

(56) References Cited

U.S. PATENT DOCUMENTS

| 5,162,240 | A | * | 11/1992 | Saitou et al. ............. 427/8 |
| 5,260,579 | A | * | 11/1993 | Yasuda et al. ........... 250/492.2 |
| 6,335,127 | B1 | | 1/2002 | Ono ............................. 430/5 |
| 6,559,463 | B1 | | 5/2003 | Ono et al. ............. 250/492.22 |
| 6,603,128 | B1 | | 8/2003 | Maehara et al. ........ 250/441.11 |
| 2001/0052576 | A1 | | 12/2001 | Shimada et al. ......... 250/492.1 |
| 2001/0054690 | A1 | | 12/2001 | Shimada et al. ............ 250/306 |
| 2002/0000766 | A1 | | 1/2002 | Ono et al. .................. 313/240 |
| 2002/0005491 | A1 | | 1/2002 | Yagi et al. ........... 250/396 ML |
| 2003/0209673 | A1 | | 11/2003 | Ono et al. ............. 250/396 R |

OTHER PUBLICATIONS

Yasuda, Hiroshi. *Applied Physics*, 63, (1994). pp. 1135–1138.

* cited by examiner

*Primary Examiner*—Nikita Wells
(74) *Attorney, Agent, or Firm*—Fitzpatrick, Cella, Harper & Scinto

(57) ABSTRACT

A deflector which makes multilayered wiring possible and prevents contamination during the manufacture includes an electrode substrate (400) having a plurality of through holes, and an electrode pair made up of first and second electrodes which oppose the side walls of each through hole in order to control the locus of a charged particle beam passing through the through hole, and a wiring substrate (500) having connection wiring pads connected to the electrode pairs of the electrode substrate to individually apply voltages to the electrode pairs. This deflector is formed by bonding the electrode substrate and wiring substrate via the connection wiring pads of the wiring substrate.

25 Claims, 29 Drawing Sheets

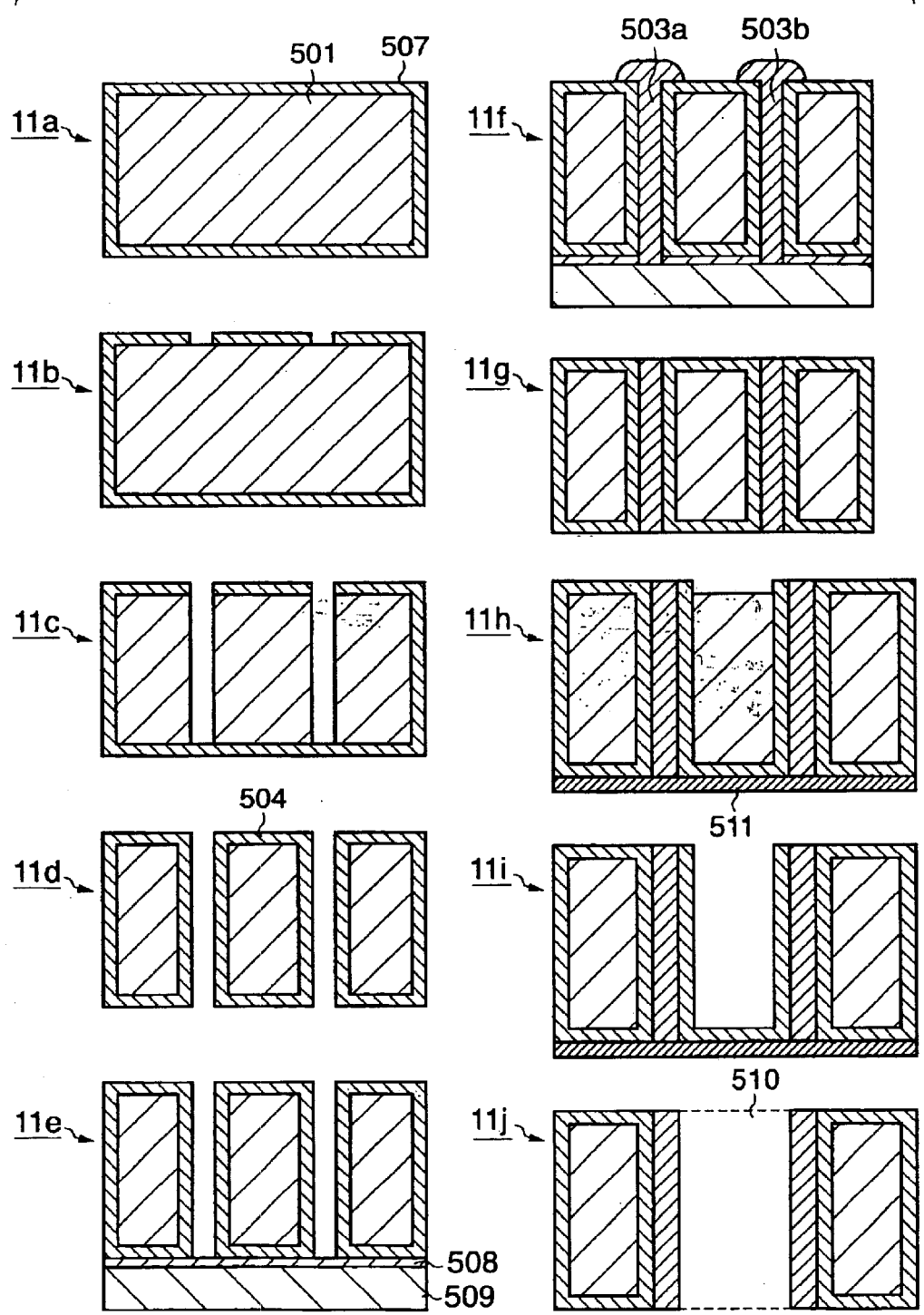

INTERMEDIATE IMAGE OF ELECTRON SOURCE

DEFLECTOR, METHOD OF MANUFACTURING DEFLECTOR, AND CHARGED PARTICLE BEAM EXPOSURE APPARATUS USING DEFLECTOR

FIELD OF THE INVENTION

The present invention relates to a technique applicable to charged particle beam exposure apparatuses such as an electron beam exposure apparatus and ion beam exposure apparatus primarily used in the exposure of semiconductor integrated circuits and the like and, more particularly, to a deflecting technique applicable to a charged particle beam exposure apparatus which draws patterns by using a plurality of charged particle beams, and to a charged particle beam exposure apparatus using this deflecting technique.

BACKGROUND OF THE INVENTION

In the production of semiconductor devices, lithography capable of exposing fine patterns of 0.1 μm or less is getting into the spotlight as a promising electron beam exposure technique. This lithography has several methods, and each method has a problem to be solved. An example is a "variable rectangular beam method" which draws a pattern with one stroke. However, the throughput of this variable rectangular beam method during patterns exposure is low. Therefore, no sufficient throughput can be obtained as a mass-production exposure apparatus for efficiently drawing patterns on a large amount of wafers.

As a lithography method capable of increasing the throughput, a "pattern projection method" which transfers a pattern formed on a stencil mask by reducing the pattern is proposed. This method is advantageous to the drawing of simple patterns having a number of repetitive portions. However, the method has many problems to be solved to increase the throughput when drawing random patterns such as logic wiring layers. Therefore, the method cannot be put into practical use without interfering with the increase in productivity.

In contrast, a multi-beam system which draws patterns at the same time with a plurality of electron beams without using any mask is proposed. This system eliminates the need to manufacture a physical mask, set the mask in an exposure apparatus, and replace the mask. Accordingly, the system can be put into practical use with many advantages. For example, a multi-electron-beam exposure apparatus for drawing patterns by using a plurality of electron beams is described in "Hiroshi Yasuda: Applied Physics 63, 1135 (1994)".

FIG. 1 is a sectional view of a blanker array used in this multi-electron-beam exposure apparatus. The blanker array is a device in which blankers having apertures and blanking electrodes are arranged in the form of an array, and can individually control emission of a plurality of electron beams. In FIG. 1, reference numerals 151 denote apertures; and 152 and 153, first and second blanking electrodes. To irradiate a sample with charged particle beams passing through the apertures, a ground potential signal is applied to the first and second blanking electrodes 152 and 153. To intercept the beams, positive- and negative-potential signals are simultaneously applied to the first and second blanking electrodes.

In the above prior art using a plurality of electron beams, it is necessary to arrange a large number of blanking electrodes in the form of an array, and independently control the blankers for turning on/off the individual beams.

Therefore, if the number of blankers increases, wiring for controlling the blanking electrodes becomes difficult to form. This will be explained with reference to FIGS. 2 and 3. FIG. 2 is a plan view showing the arrangement of a 6×6 blanker array from which an interconnection to each electrode is omitted. Referring to FIG. 2, an electron beam is emitted in the direction perpendicular to the drawing surface, and passes through an aperture 151. Reference numerals 152 and 153 denote a pair of blanking electrodes used to turn on/off the electron beam. In FIG. 2, interconnections to the blanking electrodes of the individual blankers are independent of each other. FIG. 3 is an enlarged view of a portion "A" in FIG. 2, and shows a structure including interconnections to the individual blanking electrodes when these interconnections are extracted from the electrodes in the Y direction. As shown in FIG. 3, the number of interconnections increases away from the device center in the interconnection extracting direction (the Y direction in FIG. 3). This makes it difficult to connect interconnections to thousands of blanking electrodes while the blanker pitch is held constant (e.g., 100 μm).

Another problem is the contamination of a process line. To connect a number of interconnections to blanking electrodes, it is possible to form these interconnections as a multilayered wiring structure in an electrode substrate which is an MEMS substrate on which the blanking electrodes are formed. To arrange thousands of blankers at a pitch of about 100 μm, however, the unit of the wiring design rule becomes submicron, so a process apparatus for a semiconductor LSI line is necessary. Unfortunately, the semiconductor process line has the limitation on fabrication that in order to avoid heavy metal contamination, the above-mentioned MEMS substrate fabricated by the MEMS process line cannot be processed on the semiconductor process line.

SUMMARY OF THE INVENTION

The present invention has been made in consideration of the problems of the above prior art, and has as its object to provide a deflecting technique and the like which can form interconnections to a large number of blanking electrodes, which is not influenced by the contamination on a fabrication line, which effectively prevents removal and deformation of electrodes of an electrode substrate when this electrode substrate and a wiring substrate together forming a deflector are bonded, and which can prevent charge-up and stabilize electron beams even if the electrode substrate of the deflector is directly irradiated with the electron beams. A deflector according to the present invention is characterized by principally having the following arrangements.

The present invention has as its object to provide a deflector comprising: an electrode substrate having a plurality of through holes, and an electrode pair made up of first and second electrodes which oppose side walls of each through hole in order to control a locus of a charged particle beam passing through the through hole; and a wiring substrate having connection wiring pads connected to the electrode pairs of the electrode substrate to individually apply a voltage to the electrode pairs, wherein the electrode substrate and wiring substrate are bonded via the connection wiring pads of the wiring substrate.

Another object of the present invention is to provide a deflector comprising: an electrode substrate having a plurality of through holes, an electrode pair made up of first and second electrodes which oppose side walls of each through hole in order to control a locus of a charged particle beam passing through the through hole, and electrode wiring pads formed near the first and second electrodes and electrically connected to the first and second electrodes; and a wiring substrate having connection wiring pads connected to the electrode wiring pads of the electrode substrate to individually apply a voltage to the electrode pairs, wherein the electrode substrate and wiring substrate are bonded via the connection wiring pads of the wiring substrate and the electrode wiring pads of the electrode substrate.

Further, in order to solve the above problems, the present invention provides a method of manufacturing a deflector by bonding an electrode substrate and wiring substrate, comprising steps of: preparing an electrode substrate having a plurality of through holes, and an electrode pair made up of first and second electrodes which oppose side walls of each through hole in order to control a locus of a charged particle beam passing through the through hole; preparing a wiring substrate having connection wiring pads to be connected to the electrode pairs of the electrode substrate to individually apply a voltage to the electrode pairs; and forming a beam aperture in a wiring layer of the wiring substrate before the electrode substrate and wiring substrate are bonded.

Another object of the present invention is to provide a method of manufacturing a deflector by bonding an electrode substrate and wiring substrate, comprising steps of: preparing an electrode substrate having a plurality of through holes, an electrode pair made up of first and second electrodes which oppose side walls of each through hole in order to control a locus of a charged particle beam passing through the through hole, and electrode wiring pads formed near the first and second electrodes and electrically connected to the first and second electrodes; preparing a wiring substrate having connection wiring pads to be connected to the electrode wiring pads of the electrode substrate to individually apply a voltage to the electrode pairs; and forming a beam aperture in a wiring layer of the wiring substrate before the electrode substrate and wiring substrate are bonded.

Further, the object of the present invention is to provide a charged particle beam exposure apparatus comprising: a charged particle source for emitting a charged particle beam; and a deflector for controlling an image formation position of the emitted charged particle beam, wherein the deflector comprises: an electrode substrate having a plurality of through holes, and an electrode pair made up of first and second electrodes which oppose side walls of each through hole in order to control a locus of a charged particle beam passing through the through hole; and a wiring substrate having connection wiring pads connected to the electrode pairs of the electrode substrate to individually apply voltages to the electrode pairs, and the deflector is formed by bonding the electrode substrate and wiring substrate via the connection wiring pads of the wiring substrate.

Further, the object of the present invention is to provide a charged particle beam exposure apparatus comprising: a charged particle source for emitting a charged particle beam; and a deflector for controlling an image formation position of the emitted charged particle beam, wherein the deflector comprises: an electrode substrate having a plurality of through holes, an electrode pair made up of first and second electrodes which oppose side walls of each through hole in order to control a locus of a charged particle beam passing through the through hole, and electrode wiring pads formed near the first and second electrodes and electrically connected to the first and second electrodes; and a wiring substrate having connection wiring pads connected to the electrode wiring pads of the electrode substrate to individually apply voltages to the electrode pairs, and the deflector is formed by bonding the electrode substrate and wiring substrate via the connection wiring pads of the wiring substrate and the electrode wiring pads of the electrode substrate.

Further, the object of the present invention is to provide a method of manufacturing a deflector by bonding an electrode substrate and wiring substrate, comprising steps of: preparing an electrode substrate having a plurality of through holes, and an electrode pair made up of first and second electrodes which oppose side walls of each through hole in order to control a locus of a charged particle beam passing through the through hole; and preparing a wiring substrate to be bonded to the electrode substrate, wherein in the wiring substrate preparation step, the wiring substrate comprises: holes extending through the wiring substrate in positions corresponding to the through holes formed in the electrode substrate; and an electrode electrically connected to side surfaces of the holes, a wiring layer surface at the holes, and a rear surface of the wiring substrate.

Further, the objection of the present invention is to provide a deflector comprising: an electrode substrate having a plurality of openings, and a plurality of electrode pairs each made up of first and second electrodes which oppose through a corresponding one of the openings in order to deflect a charged particle beam passing through the corresponding opening; and a wiring substrate obtained by stacking a first wiring layer having a first interconnection for applying a first voltage to the first electrode and a second wiring layer having a second interconnection for applying a second voltage to the second electrode.

Further, the object of the present invention is to provide a deflector comprising: an electrode substrate having a plurality of openings, and a plurality of electrode pairs each made up of first and second electrodes which oppose through a corresponding one of the openings in order to deflect a charged particle beam passing through the corresponding opening; a first wiring substrate having a first interconnection for applying a first voltage to the first substrate; and a second wiring substrate having a second interconnection for applying a second voltage to the second electrode, wherein the electrode substrate is arranged between the first and second wiring substrates.

Further, the object of the present invention is to provide a deflector comprising: an electrode substrate having a plurality of openings, and a plurality of electrode pairs each made up of first and second electrodes which oppose through a corresponding one of the openings in order to deflect a charged particle beam passing through the corresponding opening; a wiring substrate having an interconnection for applying a predetermined voltage to the first electrode; and a ground substrate which applies a ground voltage to the second electrode, wherein the ground substrate is arranged in front of the electrode substrate and the wiring substrate with respect to a passing direction of the charged particle beam.

Further, the object of the present invention is to provide a charged particle beam exposure apparatus comprising a charged particle beam source and a deflector which deflects a charged particle beam emitted from the charged particle beam source, the deflector including: an electrode substrate having a plurality of openings, and a plurality of electrode pairs each made up of first and second electrodes which oppose through a corresponding one of the openings in order to deflect a charged particle beam passing through the corresponding opening; and a wiring substrate obtained by stacking a first wiring layer having a first interconnection for applying a first voltage to the first electrode and a second wiring layer having a second interconnection for applying a second voltage to the second electrode.

Further, the object of the present invention is to provide a charged particle beam exposure apparatus comprising a charged particle beam source and a deflector which deflects a charged particle beam emitted from the charged particle beam source, the deflector including: an electrode substrate having a plurality of openings, and a plurality of electrode pairs each made up of first and second electrodes which oppose through a corresponding one of the openings in order to deflect a charged particle beam passing through the corresponding opening; a first wiring substrate having a first interconnection for applying a first voltage to the first substrate; and a second wiring substrate having a second interconnection for applying a second voltage to the second electrode, wherein the electrode substrate is arranged between the first and second wiring substrates.

Further, the object of the present invention is to provide a charged particle beam exposure apparatus comprising a charged particle beam source and a deflector which deflects a charged particle beam emitted from the charged particle beam source, the deflector including: an electrode substrate having a plurality of openings, and a plurality of electrode pairs each made up of first and second electrodes which oppose through a corresponding one of the openings in order to deflect a charged particle beam passing through the corresponding opening; a wiring substrate having an interconnection for applying a predetermined voltage to the first electrode; and a ground substrate which applies a ground voltage to the second electrode, wherein the ground substrate is arranged nearer to the charged particle beam source than the electrode substrate and the wiring substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view for explaining a method of manufacturing the blanker array (deflector);

DETAILED DESCRIPTION OF THE PREFERRED EMBODIMENTS

Preferred embodiments of the present invention will now be described in detail in accordance with the accompanying drawings.

<First Embodiment>

Figure 4A:
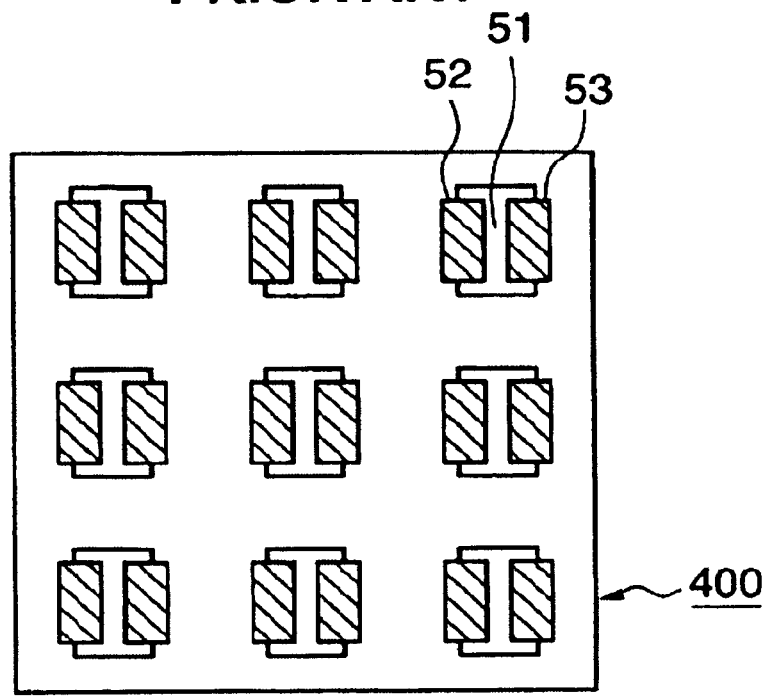
FIG. 4A is a plan view of an electrode substrate in which blanking electrodes of a 3×3 blanker array are arranged.
Figure 4B:
FIG. 4B is a sectional view of the electrode substrate shown in FIG. 4A.
Figure 5:
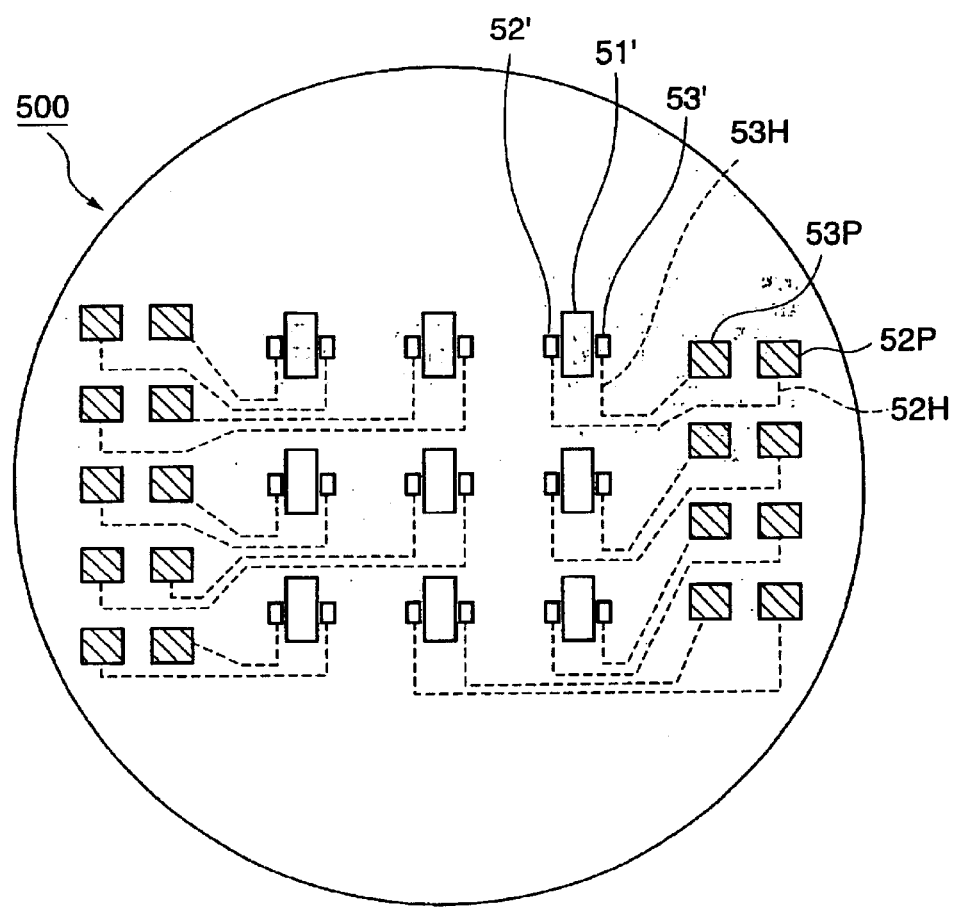
FIG. 5 is a plan view of a wiring substrate according to the first embodiment.
Figure 6:
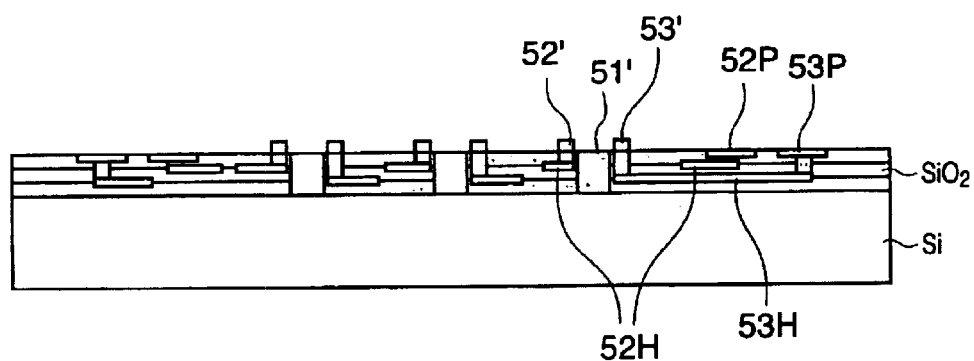
FIG. 6 is a sectional view of the wiring substrate shown in FIG. 5.

The first embodiment of a deflector and the like according to the present invention will be described below with reference to FIGS. 4A to 10. FIG. 4A is a plan view of an electrode substrate 400 in which blanking electrodes of a 3×3 blanker array are arranged. FIG. 4B is a sectional view of the electrode substrate 400. An insulator for insulating the blanking electrodes and the electrode substrate is not shown in FIG. 4B. In FIG. 4A, reference numerals 52 and 53 denote the blanking electrodes; and 51, beam apertures. FIG. 5 is a plan view of a wiring substrate 500. In FIG. 5, reference numerals 52P and 53P denote voltage application pads for applying a voltage from an external power supply (not shown); and 52' and 53', connection wiring pads for bonding. The connection wiring pads 52' and 53' electrically connect interconnections 52H and 53H from the voltage application pads 52P and 53P to the electrodes 52 and 53, respectively, of the electrode substrate 400. Beam apertures 51' in a wiring layer are smaller than the beam apertures 51 in the electrode substrate 400 (FIGS. 4A and 4B). FIG. 6 is a sectional view of the wiring substrate 500 shown in FIG. 5.

Figure 7:
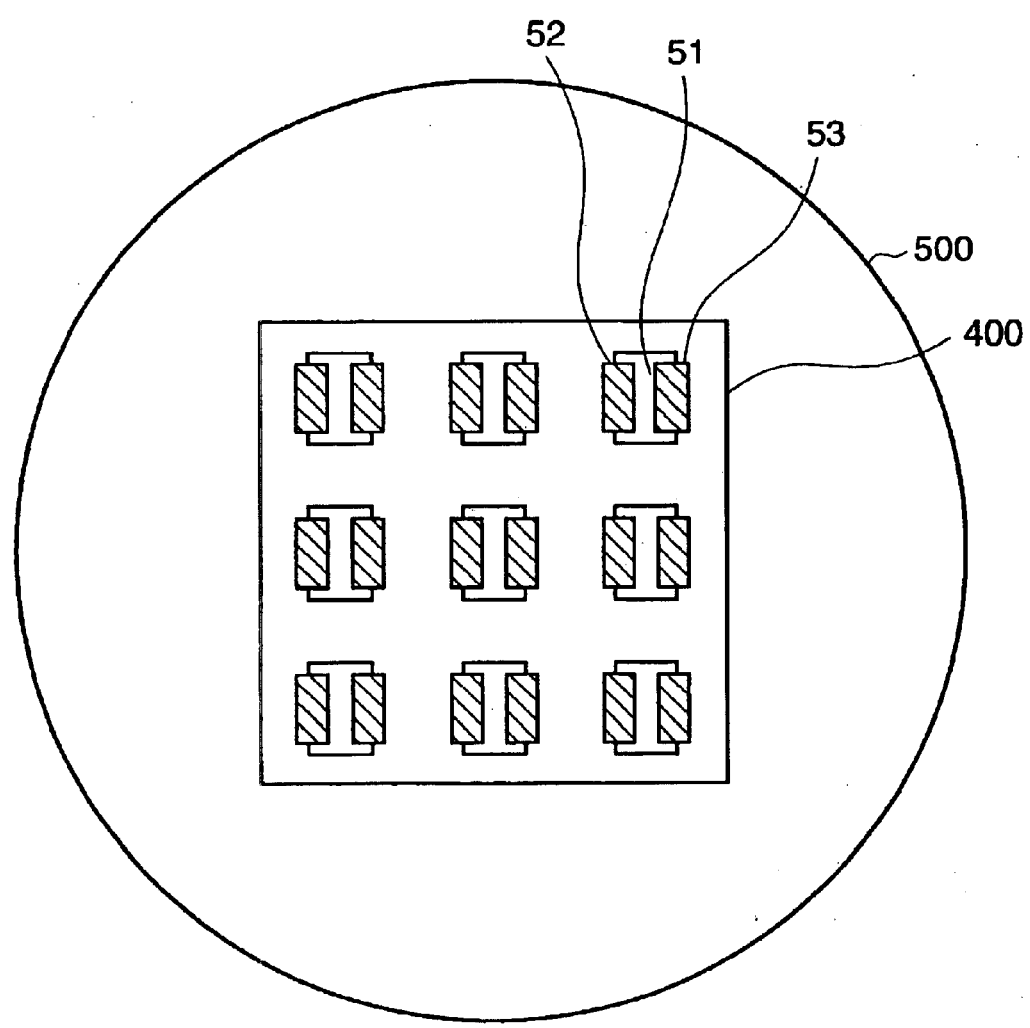
FIG. 7 is a plan view showing the state in which the electrode substrate and wiring substrate according to the first embodiment are bonded.
Figure 8:
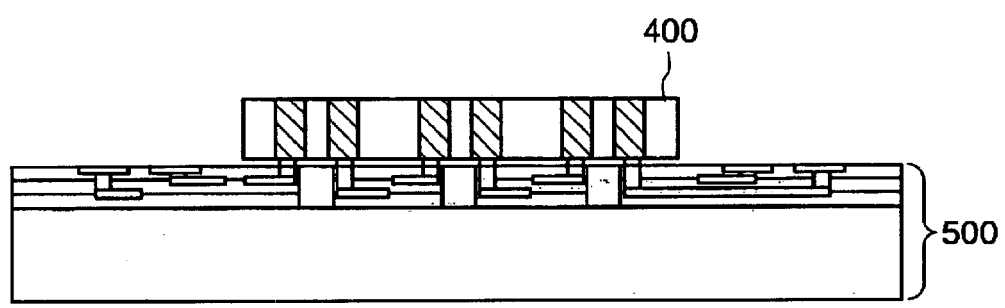
FIG. 8 is a sectional view showing the state in which the electrode substrate and wiring substrate according to the first embodiment are bonded.

The electrode substrate 400 shown in FIGS. 4A and 4B are electrically bonded to the wiring substrates 500 shown in FIG. 5 via the connection wiring pads 52' and 53'. FIGS. 7 and 8 are a plan view and sectional view, respectively, showing the state in which the electrode substrate 400 and wiring substrate 500 are bonded.

Figure 9:
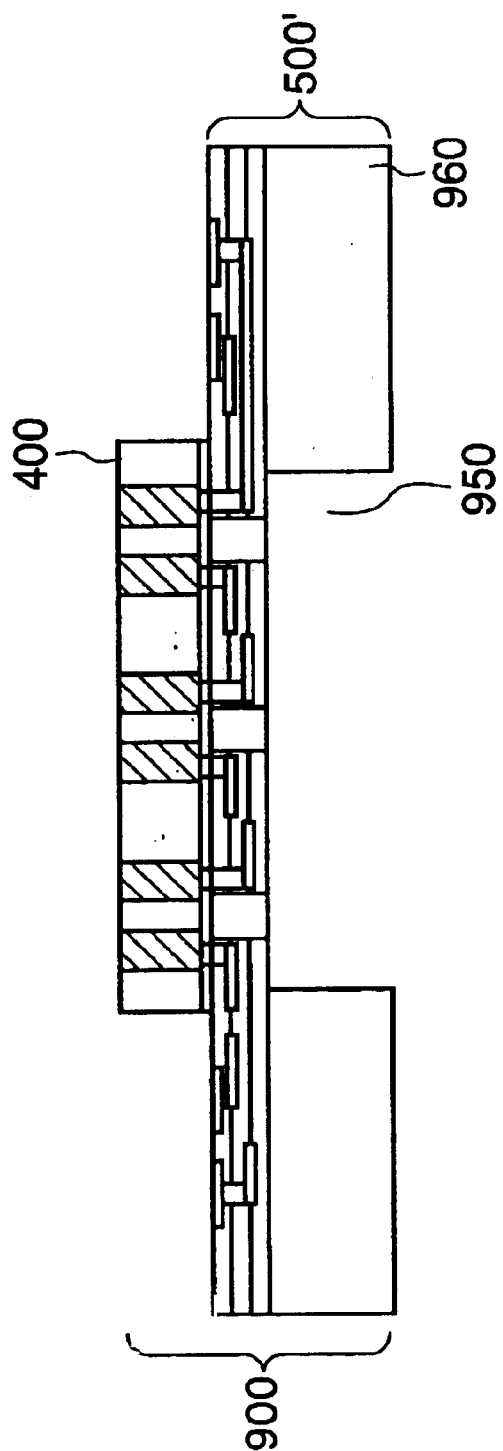
FIG. 9 is a sectional view showing a blanker array (deflector) formed by forming apertures in the rear surface, when viewed from the electrode substrate, of a handling layer (Si substrate) of the wiring substrate in the first embodiment.

FIG. 9 shows a blanker array (deflector) 900 formed by forming a rear-surface hole 950 in the rear surface, when viewed from the electrode substrate 400, of a handling layer (Si substrate) 960 of the wiring substrate 500.

Figure 10:
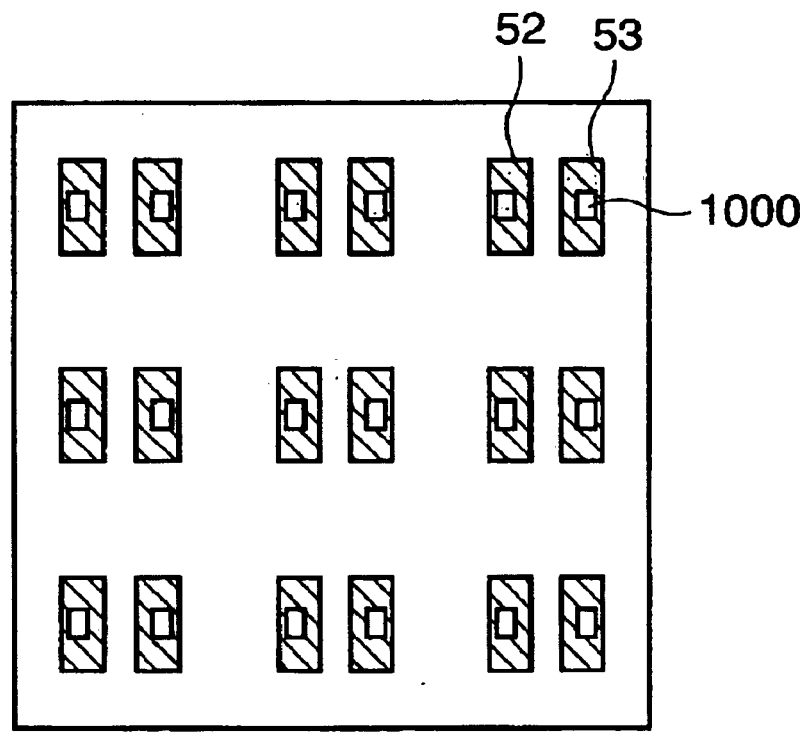
FIG. 10 is a view showing the positional relationship between the blanking electrodes of the electrode substrate and connection wiring pads of the wiring substrate in the first embodiment.

FIG. 10 is a view showing the positional relationship between the blanking electrodes (52 and 53) of the electrode substrate 400 and the connection wiring pads (52' and 53') of the wiring substrate 500 when the electrode substrate 400 and wiring substrate 500 are bonded. The connection wiring pads (52' and 53') of the wiring substrate 500 are directly bonded to the blanking electrodes (52 and 53) of the electrode substrate 400 to form junctions 1000.

A method of manufacturing the blanker array 900 will be described below. First, a method of forming the electrode substrate 400 will be explained with reference to FIG. 11.

(1) A substrate 501 made of silicon is prepared. The thickness of the substrate 501 is an important factor for determining the deflection sensitivity. For example, a substrate having a thickness of about 200 μm can be used. 1.5-μm thick silicon dioxide 507 is then formed on the upper and lower surfaces of the substrate 501 by thermal oxidation (11a of FIG. 11).

(2) An etching mask (not shown) is formed on the surface of the substrate 501 by photolithography using a novolak-based resist. The silicon dioxide 507 is etched by reactive ion etching using a gas such as $CF_4$ or $CHF_3$, and the resist is removed after that (11b of FIG. 11).

(3) The substrate 501 made of silicon is then subjected to reactive ion etching using an inductively coupled plasma and BOSCH process, thereby exposing the silicon dioxide 507 on the bottom surface (11c of FIG. 11).

(4) The silicon dioxide 507 is removed by using buffered hydrofluoric acid (not shown). After that, thermal oxidation is used to form a 1.5-μm thick insulating layer 504 made of silicon dioxide on the upper and lower surfaces and the side walls of holes of the substrate 501 (11d of FIG. 11).

(5) A conductive substrate 509 is prepared by forming a gold (Au) film on an insulator such as glass. The conductive substrate 509 may also be a metal substrate. The conductive substrate 509 is then coated with a novolak-based resist 508, and the substrate 501 and conductive substrate 509 are adhered (11e of FIG. 11).

(6) Reactive ion etching using oxygen is performed to remove the resist 508 on the bottoms of the holes, thereby exposing the conductive substrate 509. After that, gold is electroplated until gold layers 503a and 503b protrude from the substrate 501 (11f of FIG. 11).

(7) The whole structure including the substrate 501 is dipped in an organic solvent such as acetone, and ultrasonic cleaning is performed to remove the resist 508 and conductive substrate 509. Then, the upper and lower surfaces of the substrate 501 are planarized by polishing (11g of FIG. 11).

(8) The lower surface is coated with a resist or the like to form a protective film 511. The surface opposite to the protective film 511 is coated with 8-μm thick AZP4620 (Clariant Japan) as a novolak-based resist, and photolithography is performed to form an etching mask (not shown). After that, reactive ion etching using a gas such as $CF_4$ is performed to form a hole in the insulating layer 504, thereby exposing the silicon substrate 501 (11h of FIG. 11).

(9) The silicon substrate 501 is subjected to reactive ion etching using an inductively coupled plasma and BOSCH process, thereby exposing the insulating layer 504 on the bottom surface (11i of FIG. 11).

(10) Buffered hydrofluoric acid is used to remove the silicon dioxide insulating layer 504 and expose the deflecting electrodes 503a and 503b. In this step, the lower surface is not etched because it is protected by the protective film 511 such as a resist. After that, the resist 511 is removed (11j of FIG. 11).

A method of forming the wiring substrate 500 will be described below with reference to FIG. 6. First, a 500-nm thick insulating film ($SiO_2$) is deposited on an Si substrate. After that, a 30-nm thick Ti layer for increasing the adhesion to the insulating film, an 80-nm thick TiN layer as a diffusion barrier, and a 300-nm thick Al—Cu alloy layer as a wiring material are deposited by sputtering. A wiring process is then performed by photolithography and dry etching to form a first wiring layer (53H). An insulating film is deposited by low-temperature CVD and dry-etched by etch back, and another insulating film is deposited again and planarized.

Subsequently, connection holes (via holes) are formed by using photolithography and dry etching, and a second wiring layer (52H) is formed. Voltage application pads (52P and 53P) are formed by similar steps.

Furthermore, resist patterning is performed by photolithography, and 30-nm thick TiN and 2,000-nm thick Au are deposited. After that, connection wiring pads 52' and 53' are formed by a lift-off method. When Au—Sn eutectic bonding is to be used to bond the wiring substrate 500 to the electrode substrate 400, Au is deposited first and then Sn is deposited before the connection wiring pads 52' and 53' are formed. Although Au is deposited by evaporation, it is also possible to obtain thicker connection wiring pads (bumps) by electroplating. Finally, beam apertures 51' are formed in the wiring layers by photolithography and dry etching. Since it is difficult to form these beam apertures in the wiring layers after the electrode substrate 400 and wiring substrate 500 are bonded, the beam apertures are desirably formed in the wiring layers before the bonding. However, if a rear-surface hole is also formed in the Si substrate of the wiring substrate 500 before the bonding, this means that a thin film about a few μm thick to ten-odd μm thick is to be bonded. This is unpreferable because the mechanical strength decreases.

After that, the electrode substrate 400 and wiring substrate 500 are bonded. The electrode substrate 400 and wiring substrate 500 are bonded between the electrodes (52 and 53) of the electrode substrate 400 and the connection wiring pads (52' and 53') of the wiring substrate 500. If the connection wiring pads (52' and 53') of the wiring substrate 500 are made of Sn/Au, Au—Sn—Au eutectic bonding is performed between the electrode substrate 400 and Au electrodes. That is, the electrode substrate and wiring substrate are first aligned by using alignment marks formed on these substrates beforehand, and then bonded by applying a load at a temperature of about 300° C.

Finally, the electrode substrate of the two bonded substrates is coated with a resist to protect the surface, and a rear-surface hole is formed in the rear surface by reactive ion etching using an inductively coupled plasma and BOSCH process, thereby completing the whole processing (FIG. 9).

In the above explanation, Au—Sn eutectic bonding at a temperature of about 300° C. is used as the bonding shown in FIG. 8. However, room-temperature bonding of Au—Au may also be used. This Au—Au bonding can be performed at room temperature after cleaning in Ar plasma. Therefore, the room-temperature bonding has the advantage that deformation caused by the difference between the expansion coefficients of materials upon heating can be avoided. Also, if an electron beam incident in the direction of the electrode substrate irradiates an interconnection or connection wiring pad on the wiring substrate 500, charge-up may occur or the system may become unstable. To avoid this inconvenience, it is preferable to form neither interconnections nor wiring pads in wiring substrate regions opposing through holes in the electrode substrate 400.

<Explanation of Electron Beam Exposure Apparatus>

Figure 3:
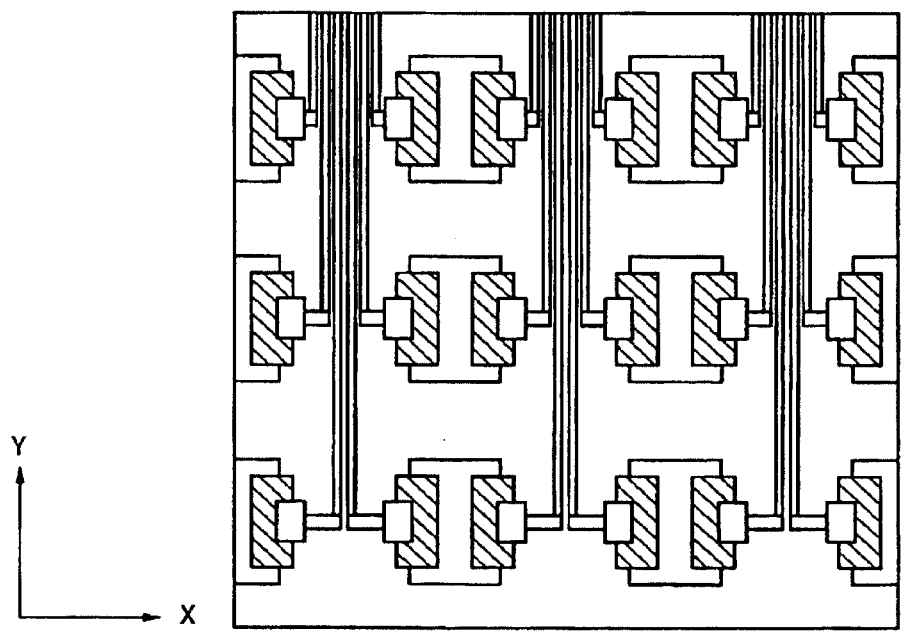
FIG. 3 is an enlarged view of a portion "A" in FIG. 2, and shows a structure including interconnections to individual blanking electrodes when these interconnections are extracted from the electrodes in the Y direction.
Figure 12A:
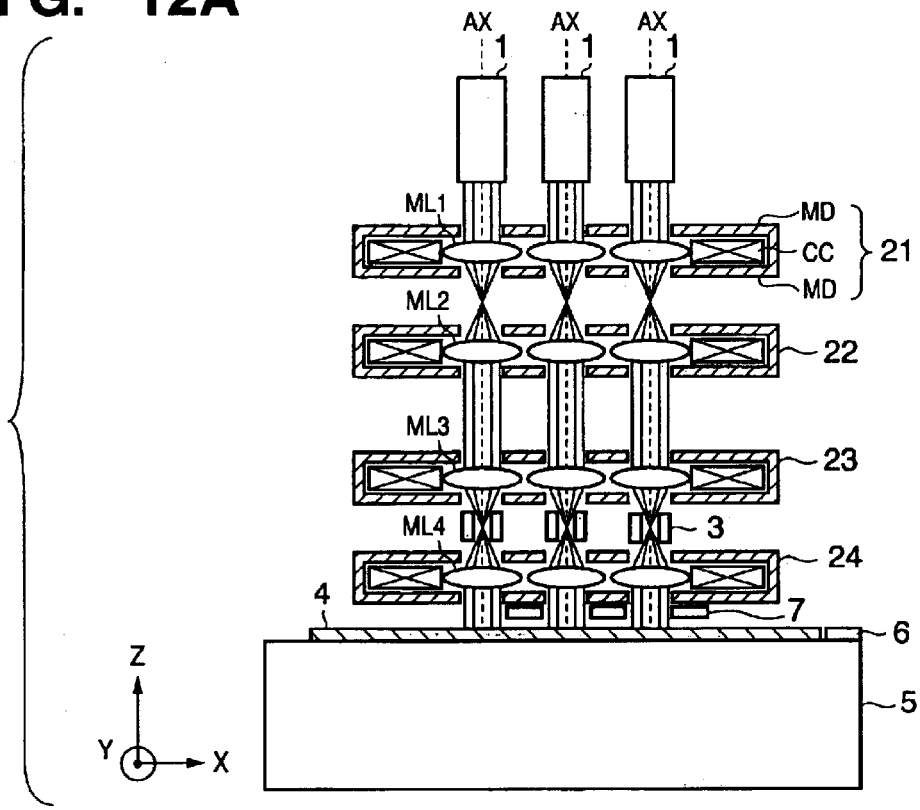
FIGS. 12A and 12B are schematic views showing the arrangement of an electron beam exposure apparatus using the deflector as a blanker.
Figure 12B:
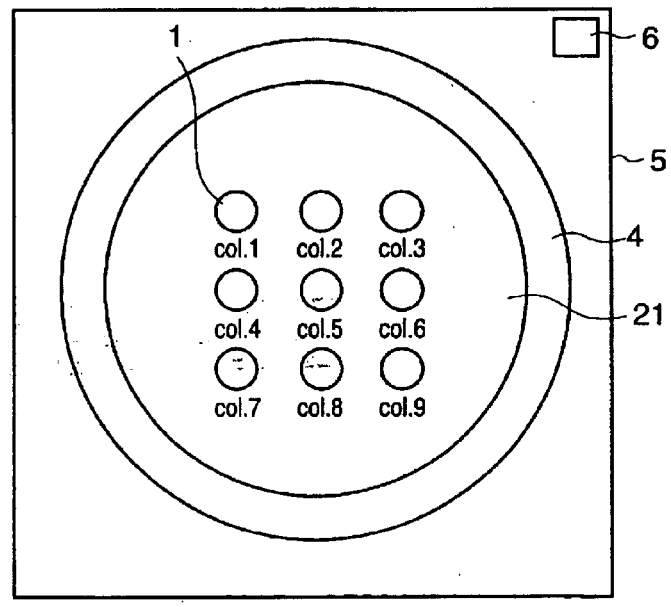

FIG. 12A is a schematic view of an electron beam exposure apparatus using the deflector according to this embodiment as a blanker. In FIG. 12A, reference numeral 1 denotes a multi-source module for forming a plurality of electron source images and emitting electron beams from these electron source images. As shown in FIG. 12B, 3×3 multi-source modules 1 are arranged. The details will be described later.

Each of magnetic field lens arrays 21, 22, 23, and 24 has a structure in which magnetic disks MD are vertically arranged with a spacing between them. The magnetic disks MD each have 3×3 apertures having the same shape, and are excited by a common coil CC. As a consequence, each aperture of the magnetic field lens array functions as the magnetic pole of a magnetic field lens ML, and a lens magnetic field is generated as designed.

A plurality of electron source images of each multi-source module 1 are projected onto a wafer 4 by four magnetic field lenses (ML1, ML2, ML3, and ML4) corresponding to the magnetic field lens arrays 21, 22, 23, and 24. An optical system which acts on electron beams emitted from one multi-source module onto a wafer is defined as a "column" hereinafter. That is, in the arrangement of this embodiment, electron beams of nine columns (col.1 to col.9) are projected onto the wafer 4 in one-to-one correspondence with the 3×3 lenses of each magnetic field lens array. More specifically, an image is once formed by the two corresponding magnetic field lenses of the magnetic field lens arrays 21 and 22, and then projected onto the wafer 4 by the two corresponding magnetic field lenses of the magnetic field lens arrays 23 and 24. By individually controlling the excitation conditions of the magnetic field lens arrays 21, 22, 23, and 24 by the common coils (CC), the optical characteristics (focal position, image rotation, and magnification) of each column can be adjusted substantially uniformly. In other words, these optical characteristics can be adjusted by the same amount.

A main deflector 3 deflects a plurality of electron beams emitted from the multi-source module 1, and displaces a plurality of electron source images in the X and Y directions on the wafer 4. A stage 5 can move in the X and Y directions perpendicular to an optical axis AX (Z-axis) and can rotate around the Z-axis with the wafer 4 mounted on it. A stage reference plate 6 is fixed on the stage 5. A reflected electron detector 7 detects reflected electrons generated when a mark on the stage reference plate 6 is irradiated with an electron beam.

Figure 13:
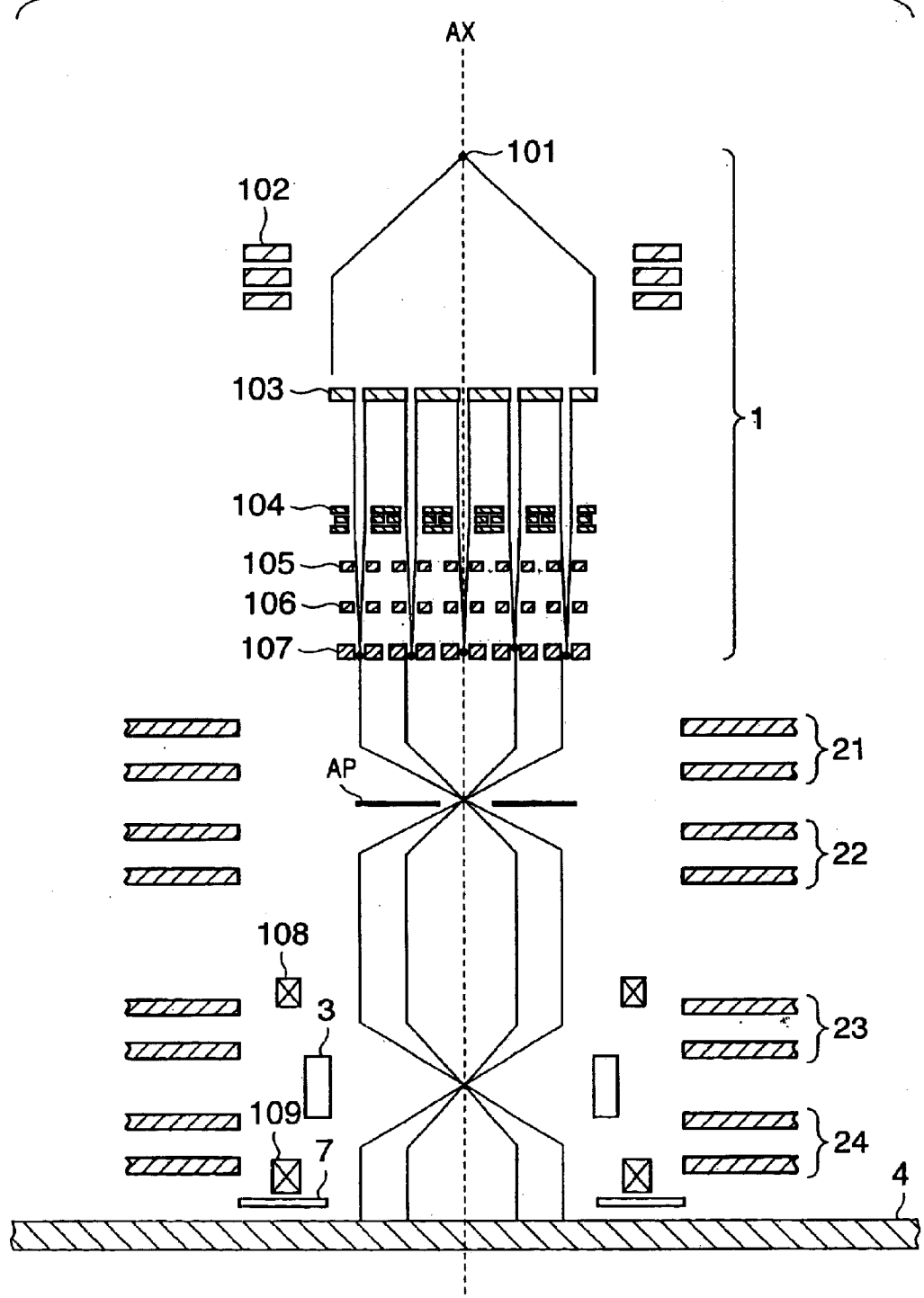
FIG. 13 is a view for explaining details of the control of an electron beam concerning one column explained in FIGS. 12A and 12B.

FIG. 13 is a view for explaining details of the control of electron beams concerning one column described above with reference to FIGS. 12A and 12B. With reference to FIG. 13, the multi-source module 1 and the function of adjusting the optical characteristics of electron beams emitted from the multi-source module 1 onto the wafer 4 will be explained below.

Reference numeral 101 denotes an electron source (crossover image) formed by an electron gun. An electron beam emitted from the electron source 101 is formed into a substantially collimated electron beam by a condenser lens 102. The condenser lens 102 of this embodiment is an electrostatic lens made up of three aperture electrodes. Reference numeral 103 denotes an aperture array in which apertures are two-dimensionally arranged; 104, a lens array in which electrostatic lenses having the same optical power are two-dimensionally arranged; 105 and 106, deflector arrays in each of which individually drivable electrostatic 8-pole deflectors are two-dimensionally arranged; and 107, a blanker array in which individually drivable electrostatic blankers are two-dimensionally arranged. The deflector described earlier in this embodiment is used as the blanker array 107.

Figure 14:
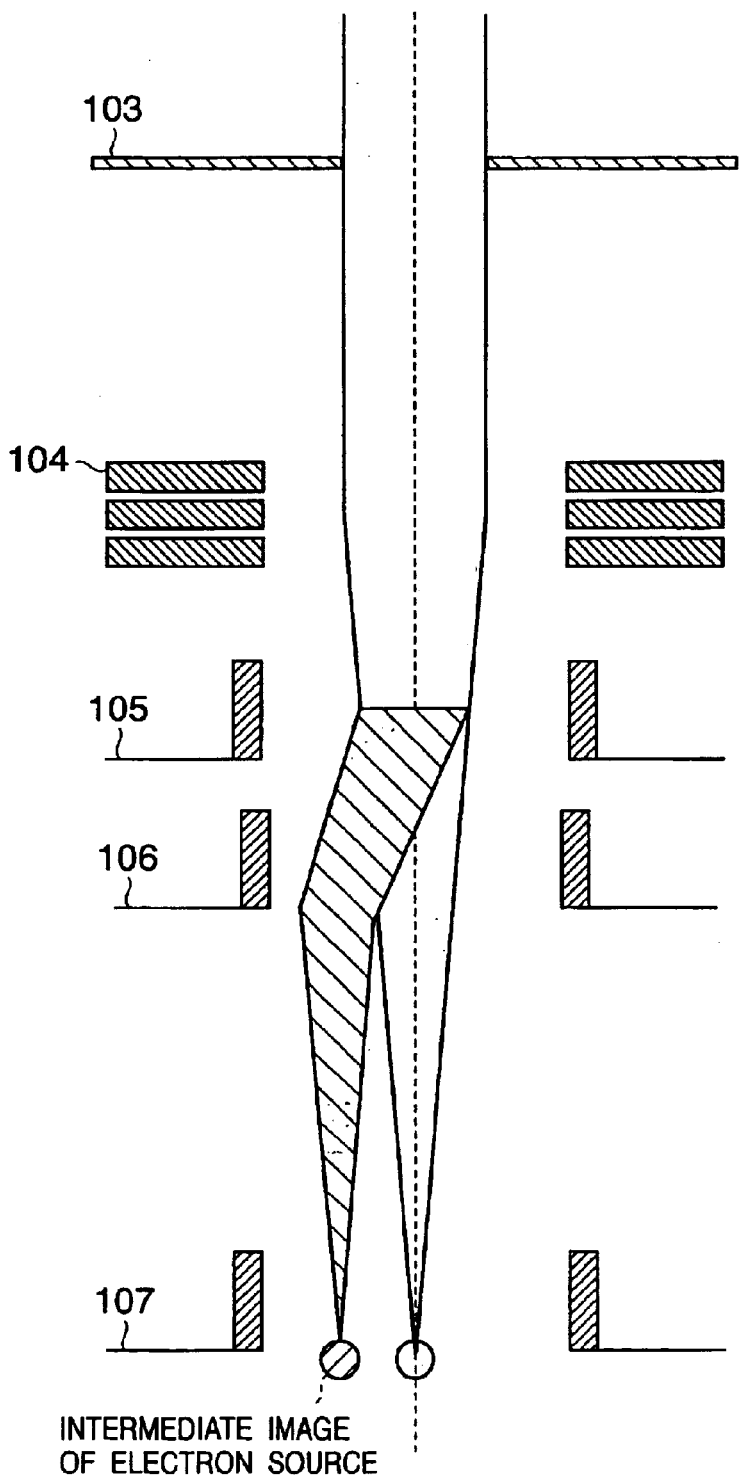
FIG. 14 is a view for explaining the functions of individual components of the electron beam exposure apparatus.

The functions of the individual components will be described below with reference to FIG. 14. The substantially collimated electron beam from the condenser lens 102 is divided into a plurality of electron beams by the aperture array 103. These divided electron beams form electron source intermediate images on the corresponding blankers of the blanker array 107 via the corresponding electrostatic lenses of the lens array 104.

In this state, the deflector arrays 105 and 106 individually adjust the positions (in the plane perpendicular to the optical axis) of the electron source intermediate images formed on the blanker array 107. Also, electron beams deflected by the blanker array 107 do not irradiate the wafer 4 because they are intercepted by a blanking aperture (AP) shown in FIG. 13. On the other hand, electron beams not deflected by the blanker array 107 irradiate the wafer 4 because they are not intercepted by the blanking aperture AP shown in FIG. 13.

Referring back to FIG. 13, the electron source intermediate images formed by the multi-source module 1 are projected onto the wafer 4 via the two corresponding magnetic field lenses of the magnetic field lens arrays 21 and 22. Of the optical characteristics when these intermediate images are projected onto the wafer 4, the rotation, the magnification, and the position on the blanker array of each intermediate image can be adjusted by the deflector arrays 105 and 106, and the focal position can be adjusted by dynamic focus lenses (electrostatic or magnetic field lenses) 108 and 109 formed for each column.

Figure 15:
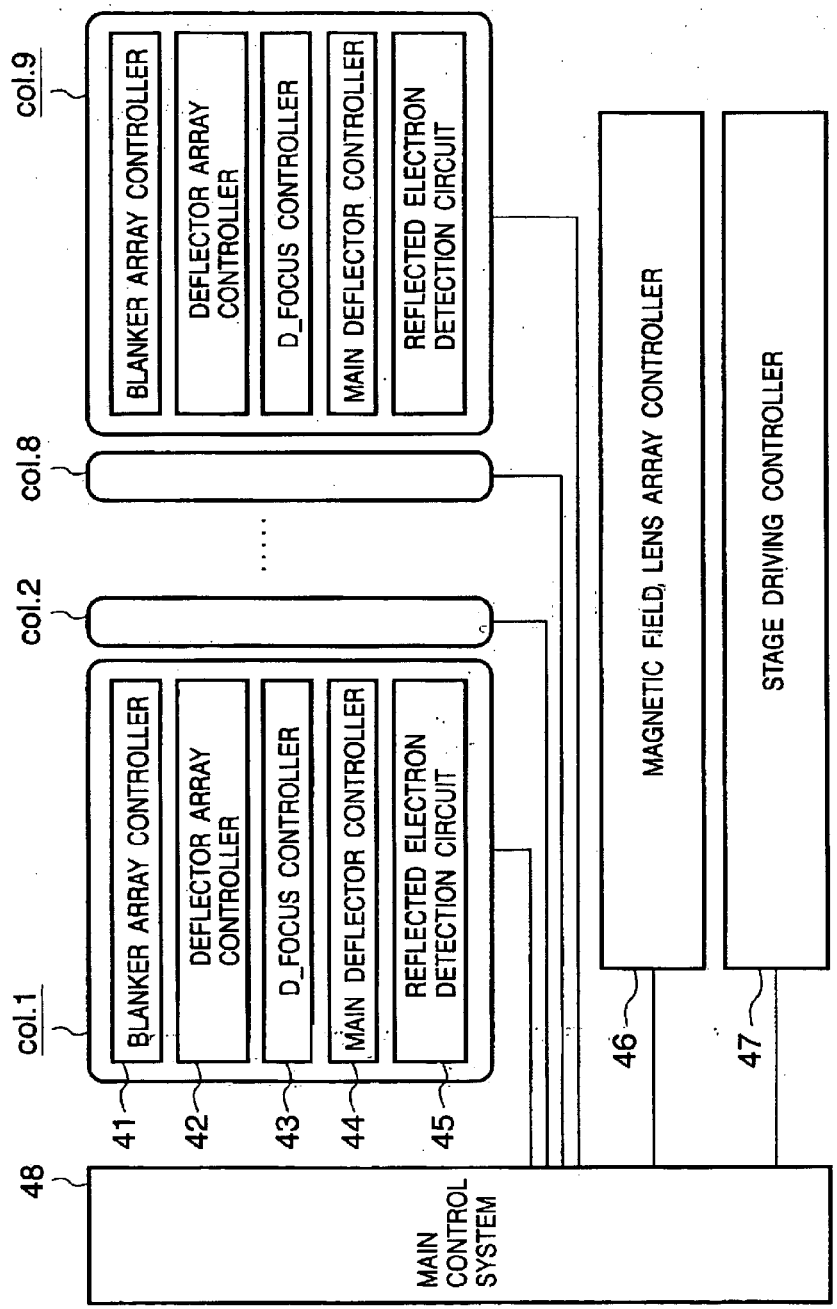
FIG. 15 is a block diagram showing the configuration of a control system for controlling the electron beam exposure apparatus.

FIG. 15 shows the configuration of a control system for controlling the electron beam exposure apparatus. A blanker array controller 41 individually controls the blankers of the blanker array 107. A deflector array controller 42 individually controls the deflectors of the deflector arrays 105 and 106.

A D_FOCUS controller 43 individually controls the dynamic focus lenses 108 and 109. A main deflector controller 44 controls the main deflector 3. A reflected electron detection circuit 45 processes a signal from the reflected electron detector 7. The blanker array controller 41, deflector array controller 42, D_FOCUS controller 43, main deflector controller 44, and reflected electron detection circuit 45 are formed for each of the columns (col.1 to col.9).

A magnetic lens array controller 46 controls the common coil of each of the magnetic field lens arrays 21, 22, 23, and 24. A stage driving controller 47 controls driving of the stage 5 in cooperation with a laser interferometer (not shown) for detecting the stage position. A main control system 48 controls these controllers described above, and manages the whole electron beam exposure apparatus.

As described above, the deflector according to this embodiment is formed by bonding the electrode substrate 400 and wiring substrate 500. Therefore, interconnections to a number of blanking electrodes can be formed by using multilayered wiring as the wiring substrate. In addition, it is possible to separately manufacture the electrode substrate 400 which causes contamination, and the wiring substrate 500 fabricated by a fabrication line vulnerable to contamination. This solves the problem of contamination on the fabrication line.

In this embodiment, the deflector of the present invention is used as the blanker array 107. However, the deflector of the present invention can be used as a general deflector for deflecting a plurality of charged particle beams. For example, the deflector of the present invention can be used as the deflector arrays 105 and 106 of the above embodiment.

Figure 1:
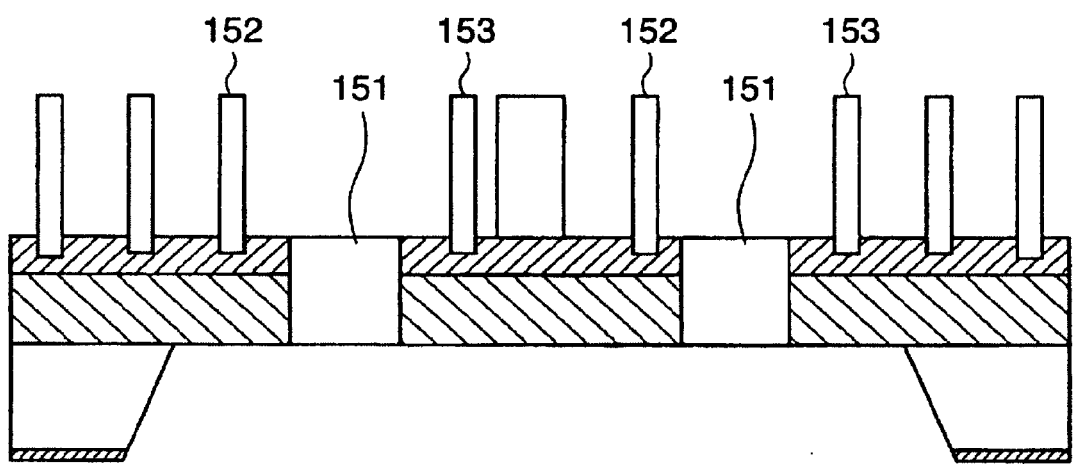
FIG. 1 is a sectional view of a blanker array used in a conventional multi-electron-beam exposure apparatus.
Figure 2:
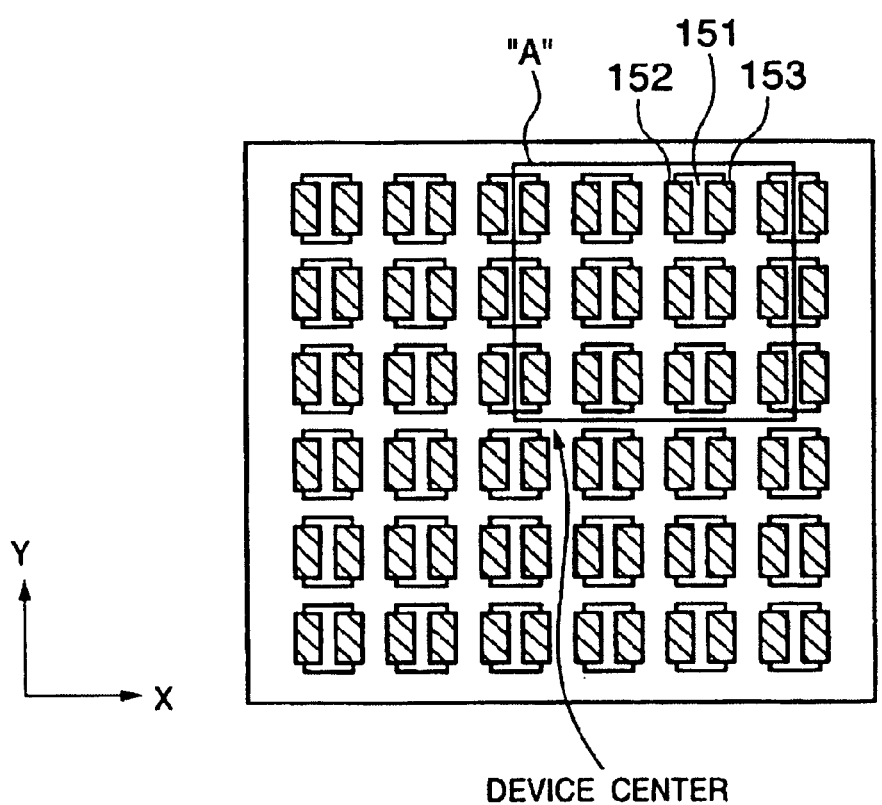
FIG. 2 is a plan view showing the conventional arrangement of a 6×6 blanker array from which interconnections to individual electrodes are omitted.

In the arrangement of this embodiment, for example, the first and second wiring layers can be formed as the first-layer interconnection (53H) and second-layer interconnection (52H) in FIG. 1, respectively. Of the electrodes formed on the, electrode substrate, for example, one of the electrodes 52 and 53 can be formed as the second electrode for applying the ground potential. In this case, the second voltage applied to the second electrode is 0 V (ground potential).

<Second Embodiment>

Figure 16A:
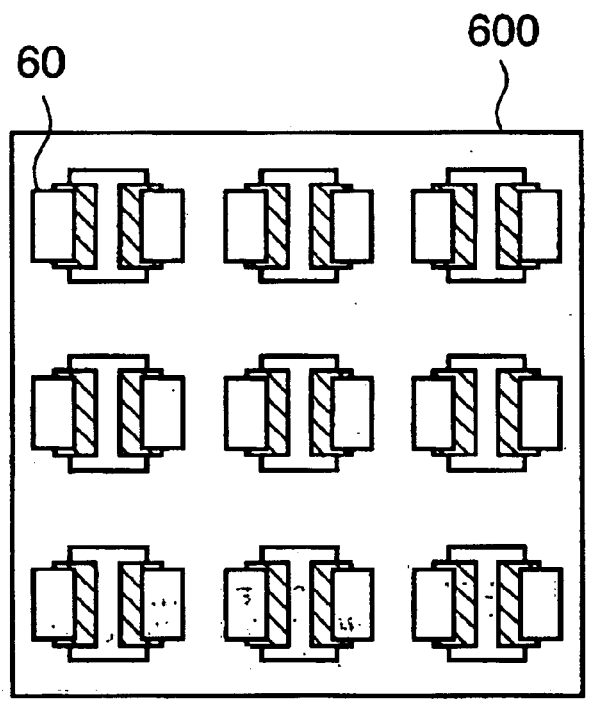
FIG. 16A is a plan view of an electrode substrate in which electrode wiring pads of a 3×3 blanker array are arranged.
Figure 16B:
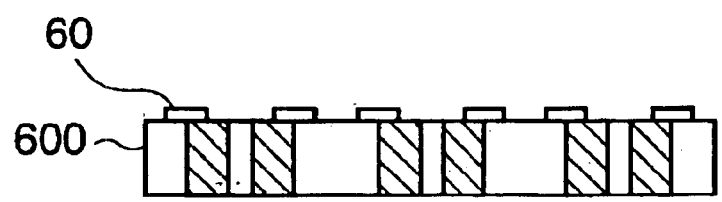
FIG. 16B is a sectional view of the electrode substrate shown in FIG. 16A.

A deflector of the second embodiment according to the present invention will be described below with reference to FIGS. 16A to 19. FIG. 16A is a plan view of an electrode substrate 600 in which 3×3 electrode wiring pads of a blanker array are arranged. FIG. 16B is a sectional view of the electrode substrate 600. Referring to FIG. 16A, electrode wiring pads 60 are electrically connected to blanking electrodes.

Figure 17:
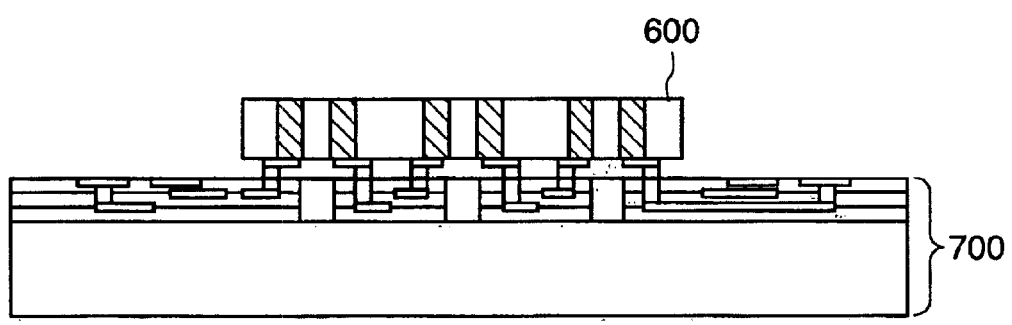
FIG. 17 is a sectional view showing the state immediately after an electrode substrate and wiring substrate according to the second embodiment are bonded.
Figure 18:
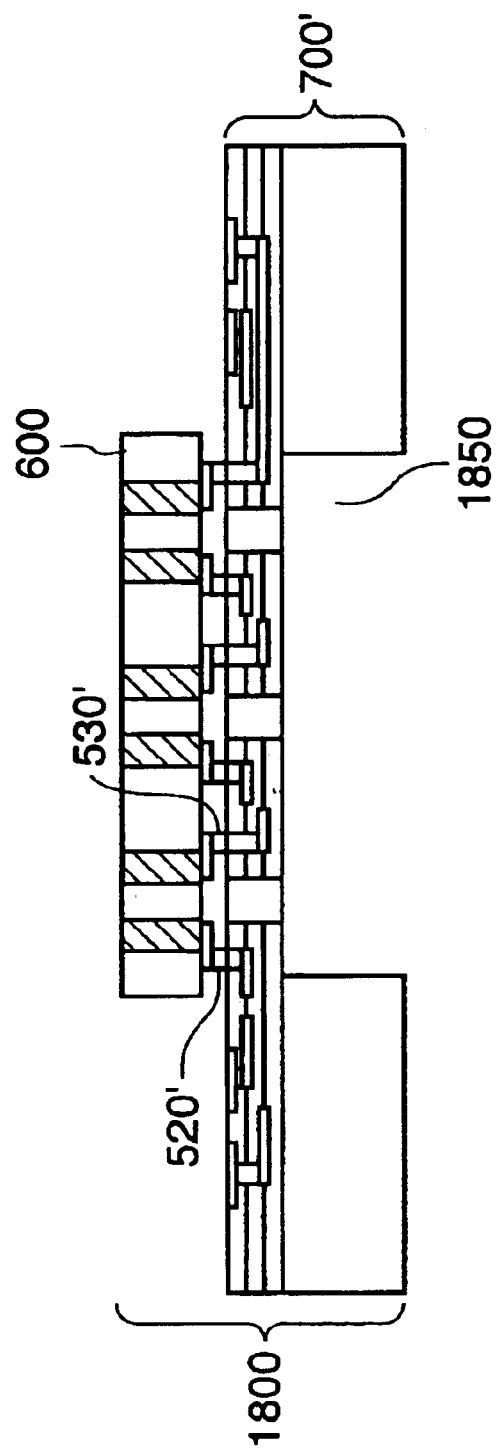
FIG. 18 is a sectional view of a deflector according to the second embodiment.
Figure 19:
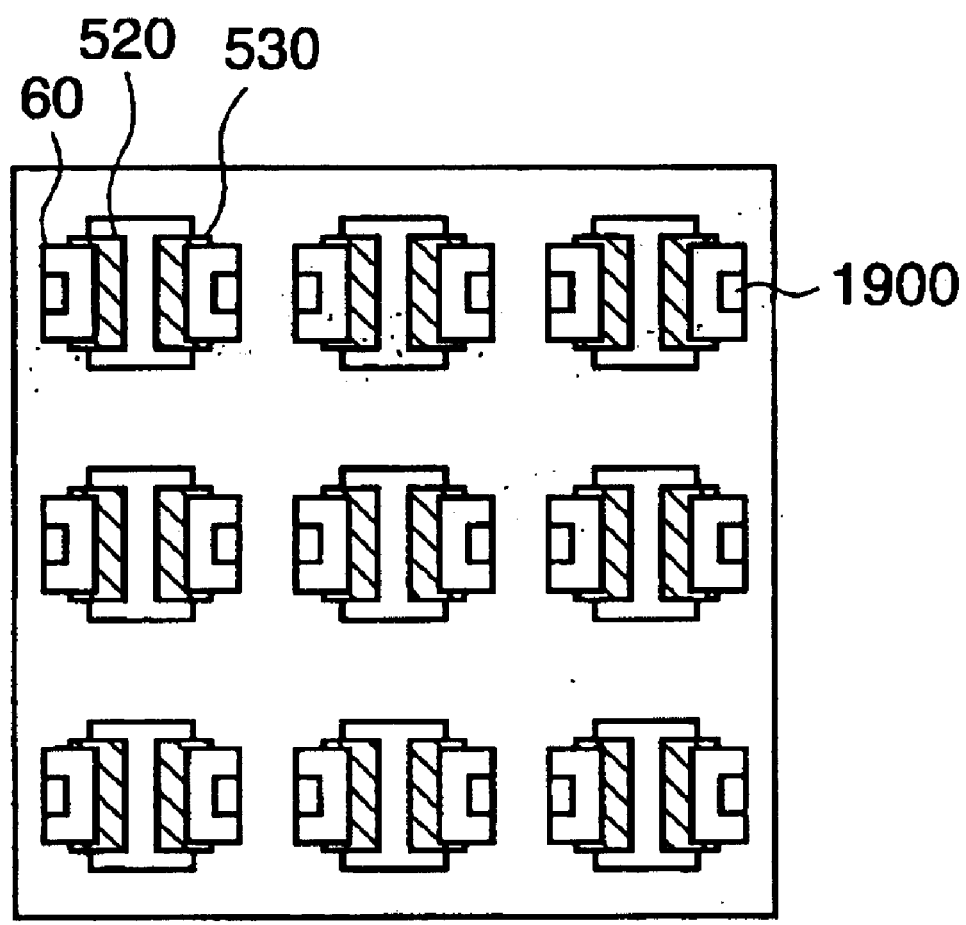
FIG. 19 is a view for explaining the positional relationship between electrodes and electrode wiring pads of the electrode substrate in the second embodiment.

FIG. 17 is a sectional view showing the state immediately after the electrode substrate 600 and a wiring substrate 700 are bonded. FIG. 18 is a sectional view of a deflector 1800 according to the second embodiment. A rear-surface hole is formed in the wiring substrate 700. In the first embodiment, junctions between the electrode substrate and wiring substrate are formed on the electrodes of the electrode substrate. However, in the arrangement of the second embodiment as shown in FIG. 19, the electrode wiring pads 60 are formed in positions different from (but close to) the positions of electrodes (520 and 530) of the electrode substrate 600. The electrode wiring pads 60 are bonded (1900 in FIG. 19) to connection wiring pads (520' and 530' in FIG. 18) of a wiring substrate 700'. A load is applied when the electrode substrate 600 and wiring substrate 700' are bonded. To prevent removal and deformation of the electrodes, therefore, the positions of the connection wiring pads (520' and 530') of the wiring substrate 700' are preferably different from the positions of the electrodes (520 and 530) of the electrode substrate 600 as in this embodiment. When the bonding positions of the electrode substrate 600 and wiring substrate 700' are formed as presented in this embodiment, it is possible to effectively prevent removal and deformation of the electrodes.

A method of fabricating the electrode substrate 600 described in the second embodiment is the same as the first embodiment except that a step of forming the electrode wiring pads 60 is added to the steps of the first embodiment, so a detailed explanation of the whole process will be omitted.

The deflector explained in this embodiment can also be applied to the electron beam exposure apparatus described in the first embodiment.

<Third Embodiment>

Figure 20:
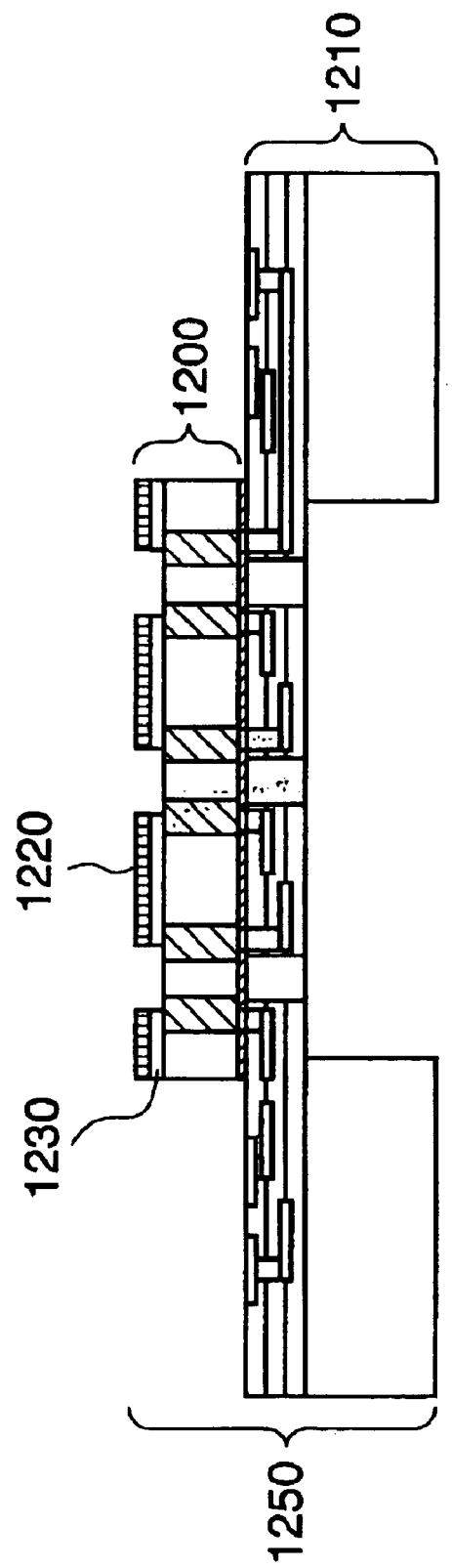
FIG. 20 is a sectional view for explaining the arrangement of a deflector according to the third embodiment.

A deflector of the third embodiment according to the present invention will be described below with reference to FIG. 20. This deflector according to the third embodiment has a characteristic arrangement in which GND electrodes 1220 are formed via an insulating film 1230 on that surface of the electrode substrate explained in the first embodiment, which is opposite to the surface connected to the wiring substrate. With this arrangement, even when an electrode substrate 1200 is directly irradiated with electron beams during, e.g., adjustment of the electron beams, it is possible to prevent charge-up and stabilize the electron beams.

Figure 21:
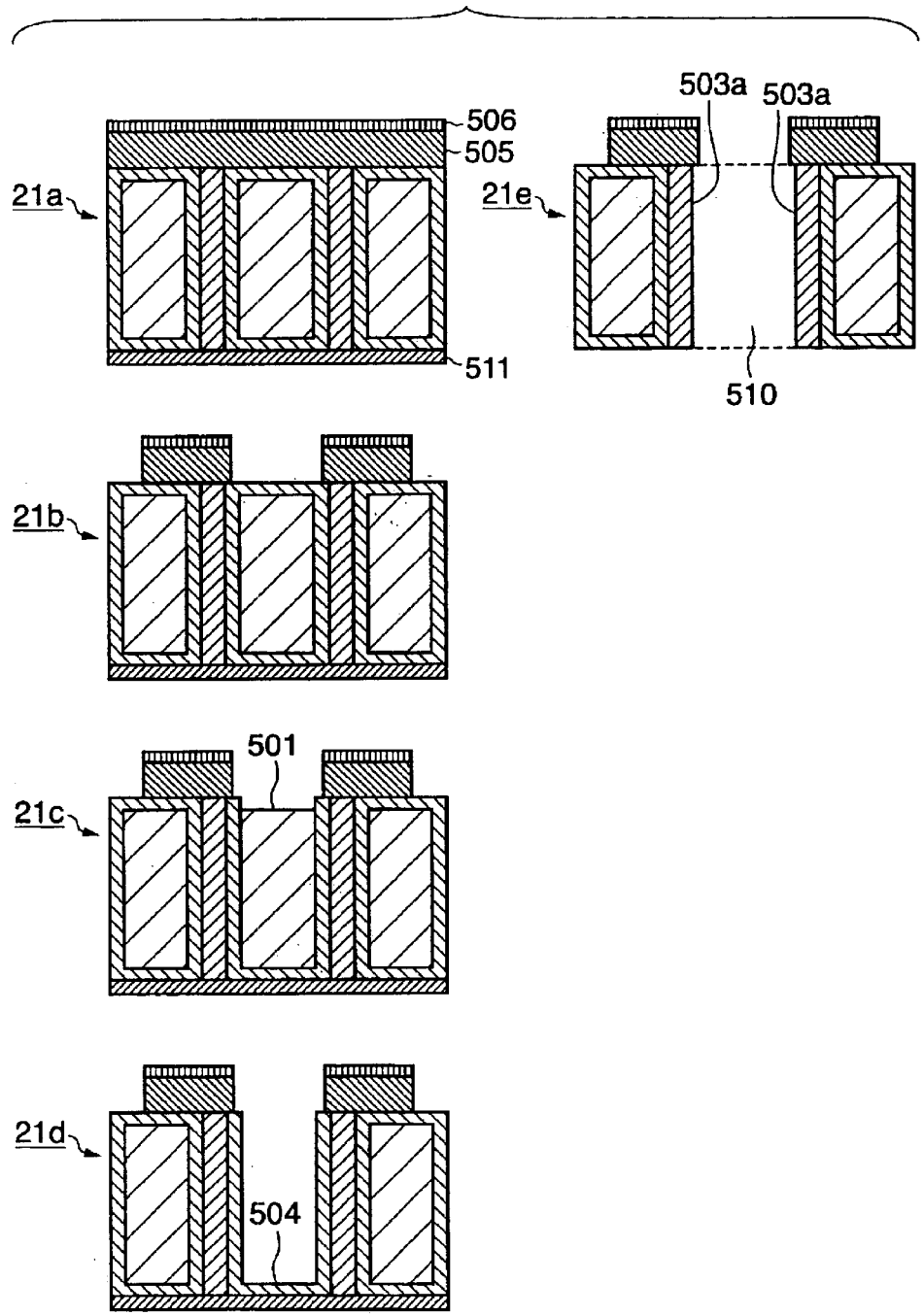
FIG. 21 is a view for explaining a method of forming an electrode substrate forming the deflector according to the third embodiment.

A method of manufacturing the electrode substrate 1200 forming a deflector 1250 according to this embodiment is the same as the first embodiment except that the process shown in FIG. 11 is changed to a process shown in FIG. 21. This process shown in FIGS. 21 to 22B will be explained below.

(1) A 1-μm thick silicon nitride film as an insulating film 505 is formed by plasma CVD. Then, 5-nm thick titanium and 50-nm thick gold forming a shield electrode 506 are continuously deposited. After that, the lower surface is coated with a resist or the like to form a protective film 511 (21a of FIG. 21).

(2) The shield electrode 506 is coated with 8-μm thick AZP4620 (Clariant Japan) as a novolak-based resist, and photolithography is performed to form an etching mask (not shown). Then, reactive ion etching using a gas such as chlorine or argon is performed to etch the titanium and gold. In addition, reactive ion etching using a gas such as $CF_4$ is performed to form a hole and pads 510a and 510b. After that, the resist is removed (21b of FIG. 21).

(3) The shield electrode 506 is coated with 8-μm thick AZP4620 (Clariant Japan) as a novolak-based resist, and photolithography is performed to form an etching mask (not shown). Then, reactive ion etching using a gas such as $CF_4$ is performed to form a hole in the insulating layer 505, thereby exposing a silicon substrate 501 (21c of FIG. 21).

(4) The silicon substrate 501 is then subjected to reactive ion etching using an inductively coupled plasma and BOSCH process, thereby exposing an insulating layer 504 on the bottom surface (21d of FIG. 21).

(5) Buffered hydrofluoric acid is used to remove the silicon dioxide insulating layer 504 and expose deflecting electrodes 503a and 503b. In this step, the lower surface is not etched because it is protected by the protective film made of a resist or the like. After that, the resist is removed (21e of FIG. 21).

The electrode substrate 1200 according to this embodiment can be formed by the above process. A step of manufacturing the deflector 1250 shown in FIG. 10 by bonding the electrode substrate 1200 to a wiring substrate 1210 is the same as the first embodiment, so a detailed explanation thereof will be omitted.

Note that the deflector described in this embodiment is applicable to the electron beam exposure apparatus described in the first embodiment.

<Fourth Embodiment>

Figure 22A:
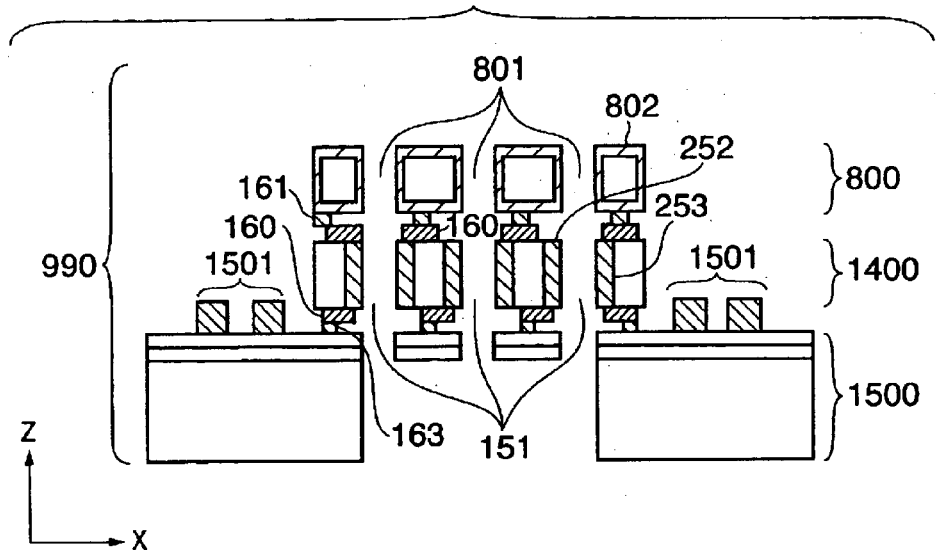
FIGS. 22A and 22B are a sectional view and plan view, respectively, of a blanker array (deflector) 990 according to the fourth embodiment.
Figure 22B:
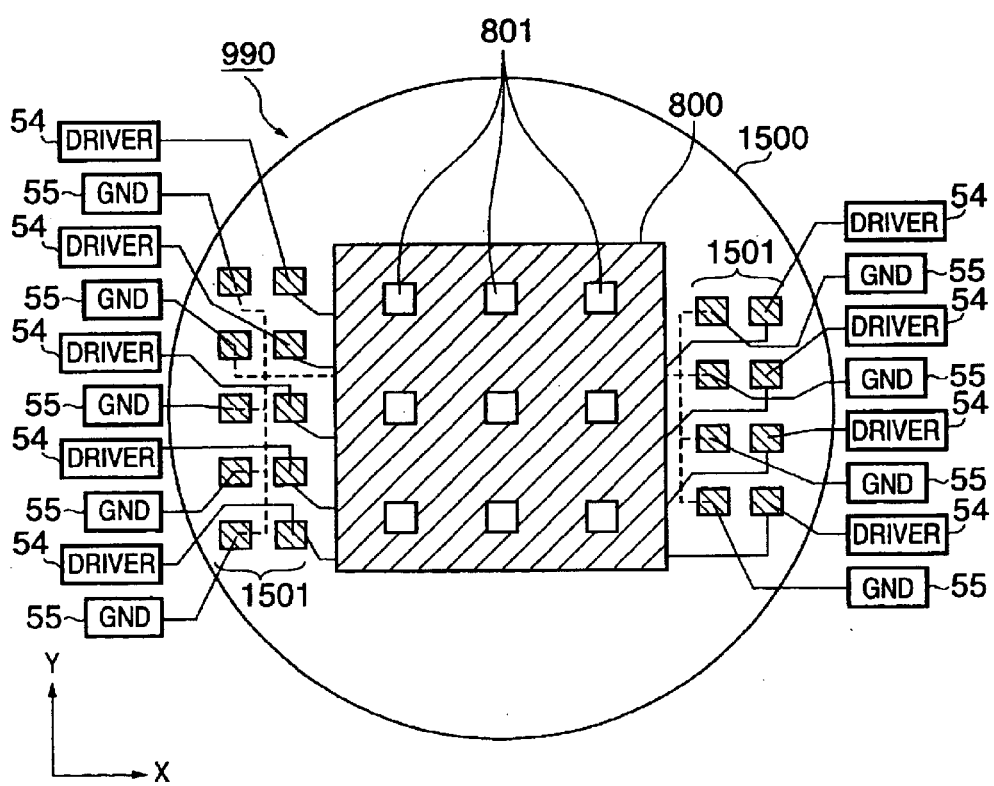

The fourth embodiment of the deflector and the like according to the present invention will be described below with reference to FIGS. 22A to 24. FIGS. 22A and 22B are a sectional view and plan view, respectively, of a blanker array (deflector) 990. The blanker array 990 is made up of an electrode substrate 1400, wiring substrate 1500, and shield electrode substrate 800. An electrical connection is obtained by stacking these substrates in the order shown in FIG. 22A and bonding them. The blanker array 990 includes 3×3 deflectors, and each deflector has a pair of blanking electrodes 252 and 253.

The blanker array 990 is driven by applying a potential by using voltage application pads 1501 formed on the wiring substrate 1500. One of the pair of blanking electrodes 252 and 253, e.g., the blanking electrode 235, of each deflector is specialized to apply the GND potential. This decreases the number of interconnections of the wiring substrate 1500. The most significant characteristic of the fourth embodiment is this arrangement simpler than that of the deflector explained in the first embodiment. The shield electrode substrate 800 is electrically connected to the blanking electrodes 253 specialized to apply the GND potential, and is set at this GND potential.

The electrode substrate 1400 according to this embodiment has substantially the same arrangement as described in the second embodiment. The electrode substrate 1400 according to the fourth embodiment has electrode wiring pads 160 on its upper and lower surfaces. Pads 163 of the wiring substrate 1500 and pads 161 of the shield electrode substrate 800 are bonded via the electrode wiring pads 160.

The shield electrode substrate 800 is a 200-μm thick Si substrate. 3×3 beam apertures 801 having a size of □25 μm (□25 μm is a square of 25 μm side) are formed into the shape of an array in positions corresponding to beam apertures 151 of the electrode substrate 1400. Also, the shield electrode substrate 800 has Au shield electrodes 802 about 1,000 Å thick formed on the upper and lower surfaces and on the side walls of the beam apertures 801. The shield electrodes 802 have a function of maintaining the whole shield electrode substrate 800 at the same potential. As shown in FIG. 22B, the electrode substrate 1400 is not seen from the upper surface side of the shield electrode substrate 800.

Figure 23:
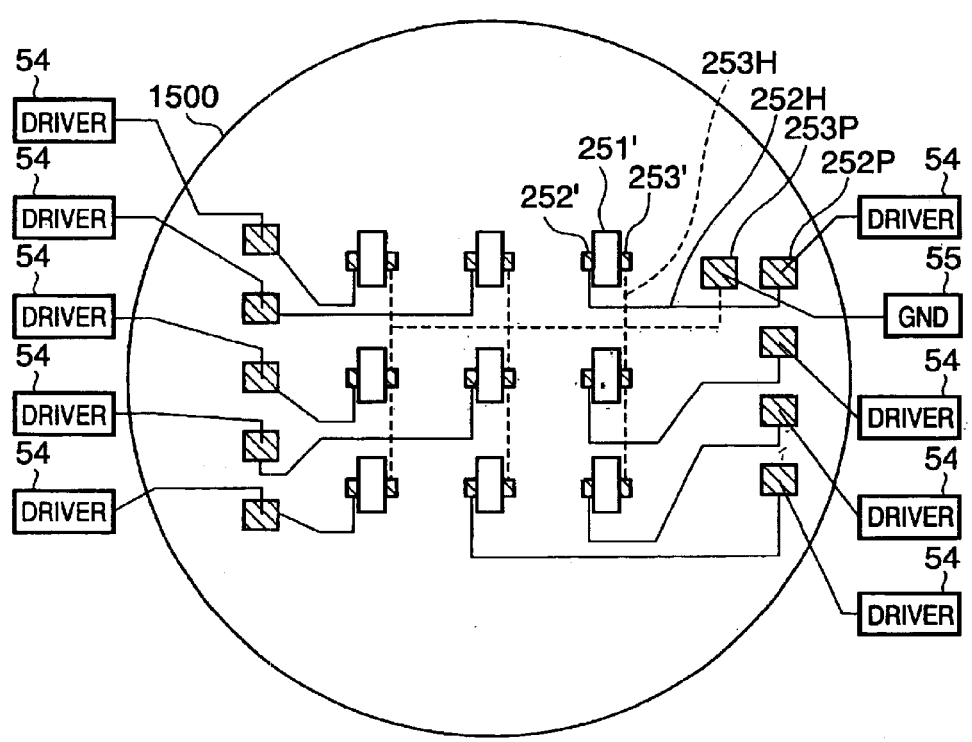
FIG. 23 is a view for explaining the structure of a wiring substrate 1500.

The structure of the wiring substrate 1500 will be described below with reference to FIG. 23. FIG. 23 shows the structure of the wiring substrate 1500. The wiring substrate 1500 has connection wiring pads 252' and 253', a beam aperture 251', and voltage application pads 252P and 253P for each deflector. The connection wiring pads 252' are connected in one-to-one correspondence with the voltage application pads 252P by interconnections 252H. Also, each voltage application pad 252P is connected to a driver 54 capable of applying an arbitrary voltage. In contrast, although the connection wiring pads 253' are electrically connected to the voltage application pad 253P via interconnections 253H, the interconnections 253H are shared by the deflectors. Therefore, the interconnections 253H and voltage application pad 253P are smaller in number than the interconnections 252H and voltage application pads 252P, and this makes the arrangement simple. The voltage application pad 253P which is connected to GND 55 can define the connection wiring pads 253' at the GND potential.

Figure 24:
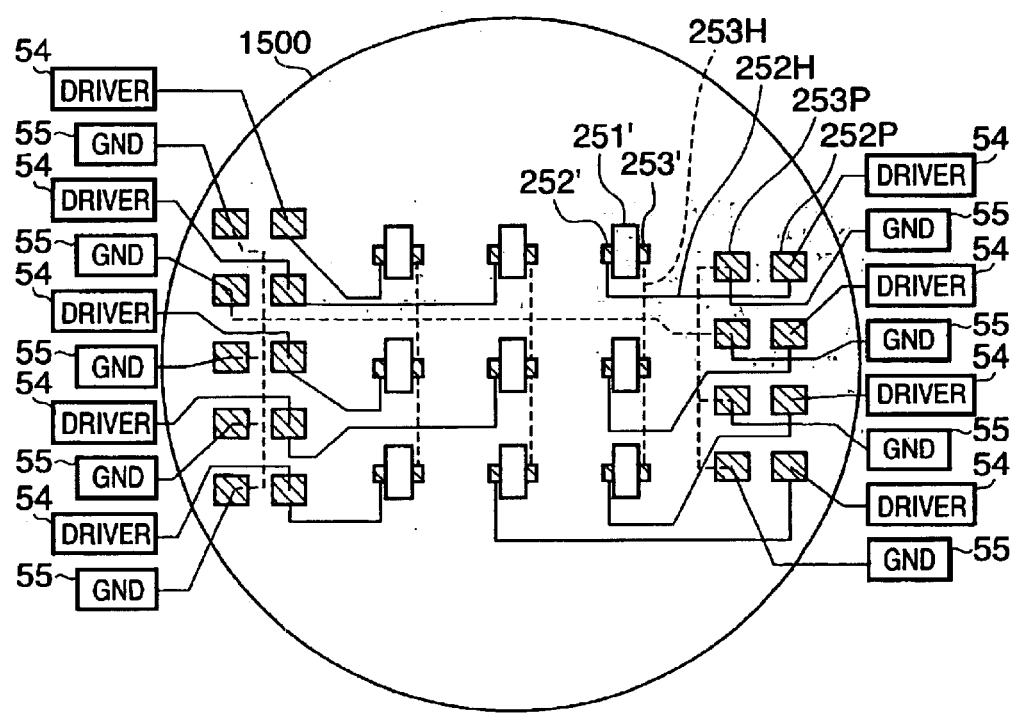
FIG. 24 is a view for explaining the structure of the wiring substrate 1500.

The wiring substrate 1500 may also be constructed as shown in FIG. 24. That is, it is also possible to share the interconnections 253H, and independently form voltage application pads 253P in one-to-one correspondence with the nine collection wiring pads 253'. The GND potential can be accurately defined by increasing the width of the interconnection 253H, and by forming the voltage application pads 252P and 253P close to each other.

As described above, it is possible, by sharing the interconnections 253H connecting to the GND 55, to decrease the number of the interconnections 253H and make the arrangement of the blanker array 990 simple. It is also possible to alleviate the limitations on the process for forming the interconnections 253H on the wiring substrate 1500, and facilitate the fabrication of the wiring substrate 1500 in this respect.

Furthermore, the interconnections 253H can be made wide. This eliminates the problem that electron beams become unstable due to noise generated when the blanker array 990 is driven at high frequency.

Also, the potential of the shield electrode substrate 800 can be defined at the GND potential via the blanking electrodes 253. Therefore, the shield electrode can be formed with a very simple arrangement.

The deflector explained in this embodiment can also be applied to the electron beam exposure apparatus described in the first embodiment.

In this embodiment, the shield electrode substrate serves as the ground substrate. In the arrangement shown in FIG. 22A, it is possible to arrange the wiring substrate 1500 as the first wiring substrate and the shield electrode substrate 800 as the second wiring substrate to obtain a deflector according to the present invention.

<Fifth Embodiment>

Figure 25:
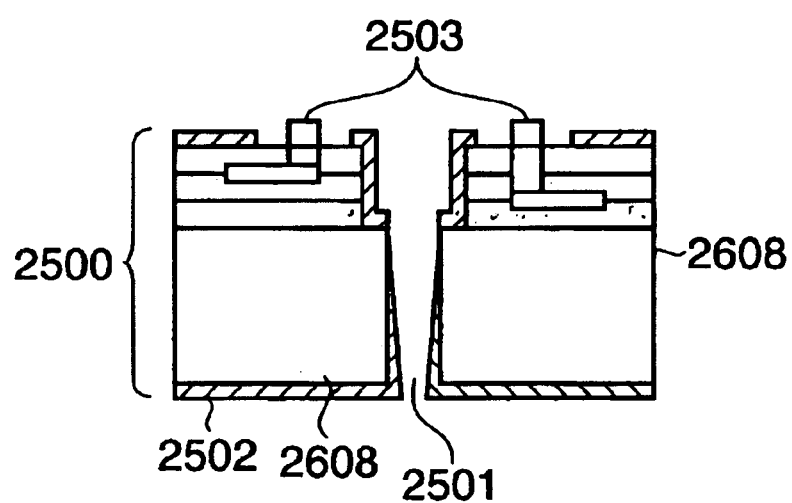
FIG. 25 is an enlarged view of a region corresponding to one blanker of a wiring substrate according to the fifth embodiment.

The fifth embodiment of the deflector and the like according to the present invention will be described below with reference to FIGS. 25 and 26. FIG. 25 is an enlarged view of a region corresponding to one blanker in a wiring substrate. The arrangement of the deflector according to the fifth embodiment differs from the wiring substrate 700 (FIG. 17) explained in the second embodiment in that a beam aperture 2501 of the wiring substrate is formed in a position corresponding to each blanker, and the side surfaces of the beam aperture 2501, the surface of a wiring layer near the beam aperture, and the lower surface of the wiring substrate are covered with a GND electrode 2502. The deflector according to this embodiment is formed by bonding a wiring substrate 2500 having this construction to the electrode substrate 600 explained in the second embodiment.

In this structure shown in FIG. 25, a handling layer (Si substrate) 2608 of the wiring substrate 2500 is formed below each connection wiring pad (bump) 2503. This increases the strength against the load applied when the wiring substrate 2500 is bonded to the electrode substrate. This makes it possible to exceptionally increase the stability when the electrode substrate and the wiring substrate 2500 are bonded. For example, in the first embodiment, in order to avoid a bonding in the thin film part of the wiring substrate, the aperture is formed in the rear surface of the wiring substrate after bonding the wiring substrate and the electrode substrate. In the wiring substrate of this embodiment, after forming all the apertures in the surface and the rear surface of the wiring substrate, it is possible to bond the wiring substrate and the electrode substrate.

Also, in the arrangement according to this embodiment, the occurrence of charge-up can be prevented by forming the GND electrodes 2502 in all regions of the wiring substrate, which can be directly irradiated with electron beams during beam adjustment or the like, so the electron beams can be stabilized.

A method of fabricating the wiring substrate 2500 according to this embodiment will be described below with reference to FIG. 26.

Figure 26:
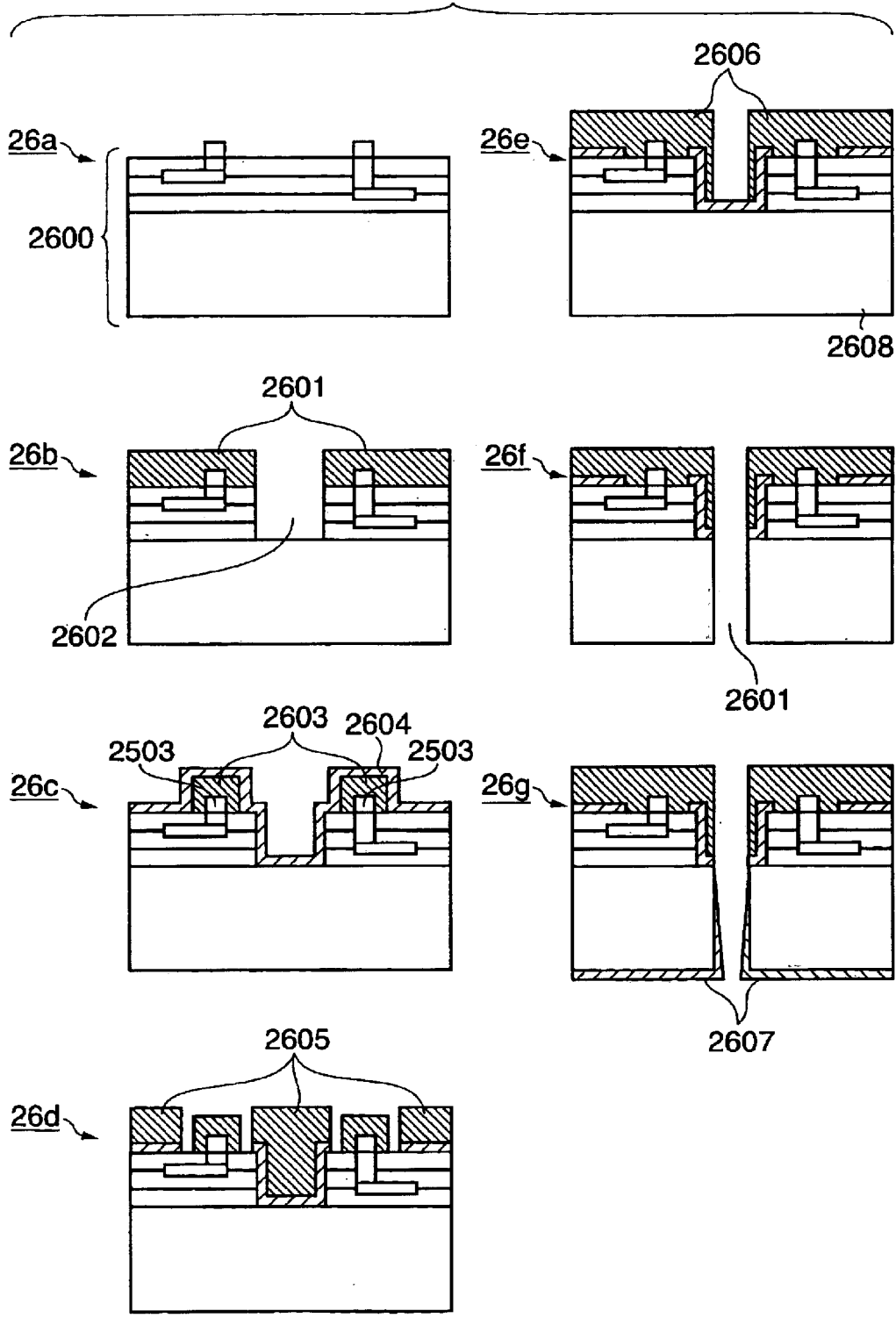
FIG. 26 is a view for explaining a method of forming an electrode substrate forming a deflector according to the fifth embodiment.

(1) First, a wiring substrate 2600 as a base is prepared. 26*a* of FIG. 26 is an enlarged view of that region of the wiring substrate 2600, which corresponds to one blanker. The surface of the wiring substrate 2600 is coated with 17-μm thick AZP4903 (Clariant Japan) as a novolak-based resin, and photolithography is performed to form a mask pattern 2601 for forming a beam aperture. Then, reactive ion etching using a gas such as $CHF_3$ is performed to form a beam aperture 2602 in a wiring layer. After that, the resist is removed (26*b* of FIG. 26).

(2) The wiring substrate 2600 is coated with 17-μm thick AZP4903 (Clariant Japan) as a novolak-based resin, and photolithography is performed to form a mask pattern 2603 with which a region near the connection wiring pad (bump) 2503 is coated. Then, 5-nm thick Ti and 300-nm thick Au forming a GND electrode 2604 are continuously deposited (26*c* of FIG. 26).

(3) The GND electrode 2604 is coated with 17-μm thick AZP4903 (Clariant Japan) as a novolak-based resin, and photolithography is performed to form a mask pattern 2605. Reactive ion etching using a gas such as chlorine or argon is then performed to etch the surface of the mask pattern 2603 and the Ti and Au very close to the surface (26*d* of FIG. 26). After that, the mask patterns 2603 and 2605 are completely removed.

(4) The wiring substrate is coated with 17-μm thick AZP4903 (Clariant Japan) as a novolak-based resin, and photolithography is performed to form a mask pattern 2606 for forming a beam aperture in the wiring substrate as a support substrate. In this step, the opening of the mask 2606 is formed inside the aperture 2602 of the wiring layer (26*e* of FIG. 26). Then, reactive ion etching using a gas such as chlorine or argon is performed to etch the Ti and Au in the opening of the mask pattern 2606. In addition, the same mask pattern 2606 is used to perform reactive ion etching using an inductively coupled plasma and BOSCH process on a silicon substrate 2608, thereby forming a beam aperture 2601 (26*f* of FIG. 26).

(5) A GND electrode 2607 is formed by continuously depositing 5-nm thick Ti and 300-nm thick Au from the lower surface side of the substrate 2608. Alternatively, 100-nm thick Cr and 300-nm thick Pd are continuously deposited from the lower surface, 1.5-nm thick Pd is formed by electroless plating (26*g* of FIG. 26), and the resist is removed. Assume that the GND electrode 2502 shown in FIG. 25 is formed by a combination of the GND electrodes 2604 and 2607. The wiring substrate 2500 according to this embodiment can be fabricated by the above process.

The deflector using the wiring substrate 2500 explained in this embodiment can also be applied to the electron beam exposure apparatus described in the first embodiment.

<Sixth Embodiment>

Figure 27:
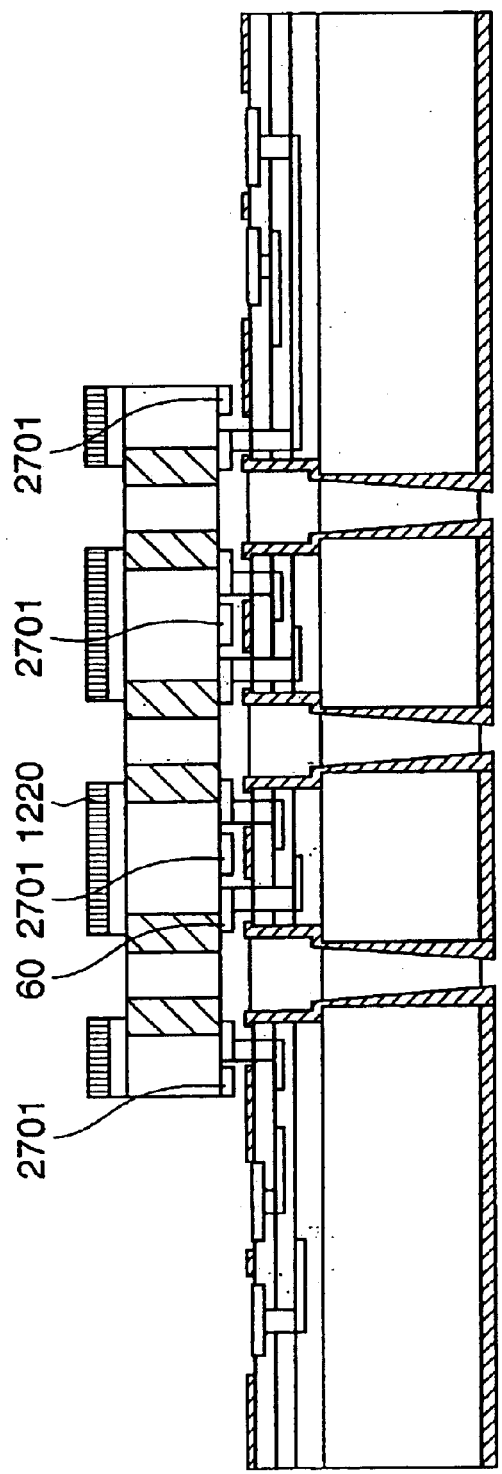
FIG. 27 is a view for explaining the structure of a deflector according to the sixth embodiment; Fig.

The sixth embodiment of a deflector and the like according to the present invention will be described below with reference to FIG. 27. In the sixth embodiment, the GND electrodes 1220 shown in the third embodiment are formed on the electrode substrate shown in the second embodiment. The wiring substrate of the fifth embodiment is bonded to the above electrode substrate to form the deflector of the sixth embodiment. GND electrodes 2701 as in the wiring substrate of the fifth embodiment are arranged on a surface (to be referred to as a lower surface) of the electrode substrate which is opposite to a surface on which the GND electrodes of the electrode substrate are formed. This makes it possible to further suppress charge-up and stabilize the electron beam.

In the sixth embodiment, the GND electrode of the third embodiment is used as the GND electrode on the surface of the electrode substrate. However, the shield electrode substrate of the fourth embodiment may replace the electrode substrate. In this case, after the wiring substrate is bonded to the electrode substrate but before the shield electrode substrate is bonded, the interconnections and bonding can be checked by bringing a probe into direct contact with a deflecting electrode, thereby advantageously eliminating defective products in advance.

The GND electrodes 1220 on the lower surface of the electrode substrate are formed simultaneously with formation of electrode wiring pads 60, and an explanation of the fabrication process will be omitted.

Note that it is possible to apply the deflector described in the sixth embodiment to the electron beam exposure apparatus described in the first embodiment.

In the arrangement of the first embodiment described above, for example, the first and second wiring layers can be formed as the first-layer interconnection (53H) and second-layer interconnection (52H) in FIG. 1, respectively. Of the electrodes formed on the electrode substrate, for example, one of the electrodes 52 and 53 can be formed as the second electrode for applying the ground potential. In this case, the second voltage applied to the second electrode is 0 V (ground potential).

In the fourth embodiment described above, the shield electrode substrate serves as the ground substrate. In the arrangement shown in FIG. 22A, it is possible to arrange the wiring substrate 1500 as the first wiring substrate and the shield electrode substrate 800 as the second wiring substrate to obtain a deflector according to the present invention.

In each of the embodiments described above, a deflector to be applied to a charged particle beam exposure apparatus is formed by bonding an electrode substrate and wiring substrate. By using multilayered wiring as the wiring substrate, interconnections can be connected to a large number of blanking electrodes.

The electrode substrate which causes contamination and the wiring substrate fabricated on a fabrication line vulnerable to contamination can be separately manufactured. This solves the problem of contamination on the fabrication line.

When the electrode substrate and wiring substrate forming the deflector are bonded, it is possible to effectively prevent removal and deformation of electrodes of the electrode substrate.

Even when the electrode substrate of the deflector is directly irradiated with electron beams during beam adjustment or the like, it is possible to prevent charge-up and stabilize the electron beams.

The number of interconnections for controlling the blanking electrodes can be substantially halved. This facilitates the formation of the wiring substrate, and makes the interconnection width larger. Accordingly, it is possible to eliminate the problem that electron beams become unstable due to noise generated when the blanker array is driven at high frequency. Also, a shield electrode can be formed by a simple arrangement.

A handling layer (Si substrate) of the wiring substrate is formed below each connection wiring pad. This increases the strength against the load applied when the wiring substrate is bonded to the electrode substrate. This makes it possible to exceptionally increase the stability when the electrode substrate and wiring substrate are bonded.

A deflector including a wiring substrate having a structure in which GND electrodes are formed in all regions on the wiring substrate, which can be directly irradiated with electron beams can prevent charge-up and stabilize the electron beams.

<Embodiment of Semiconductor Production>

Figure 28:
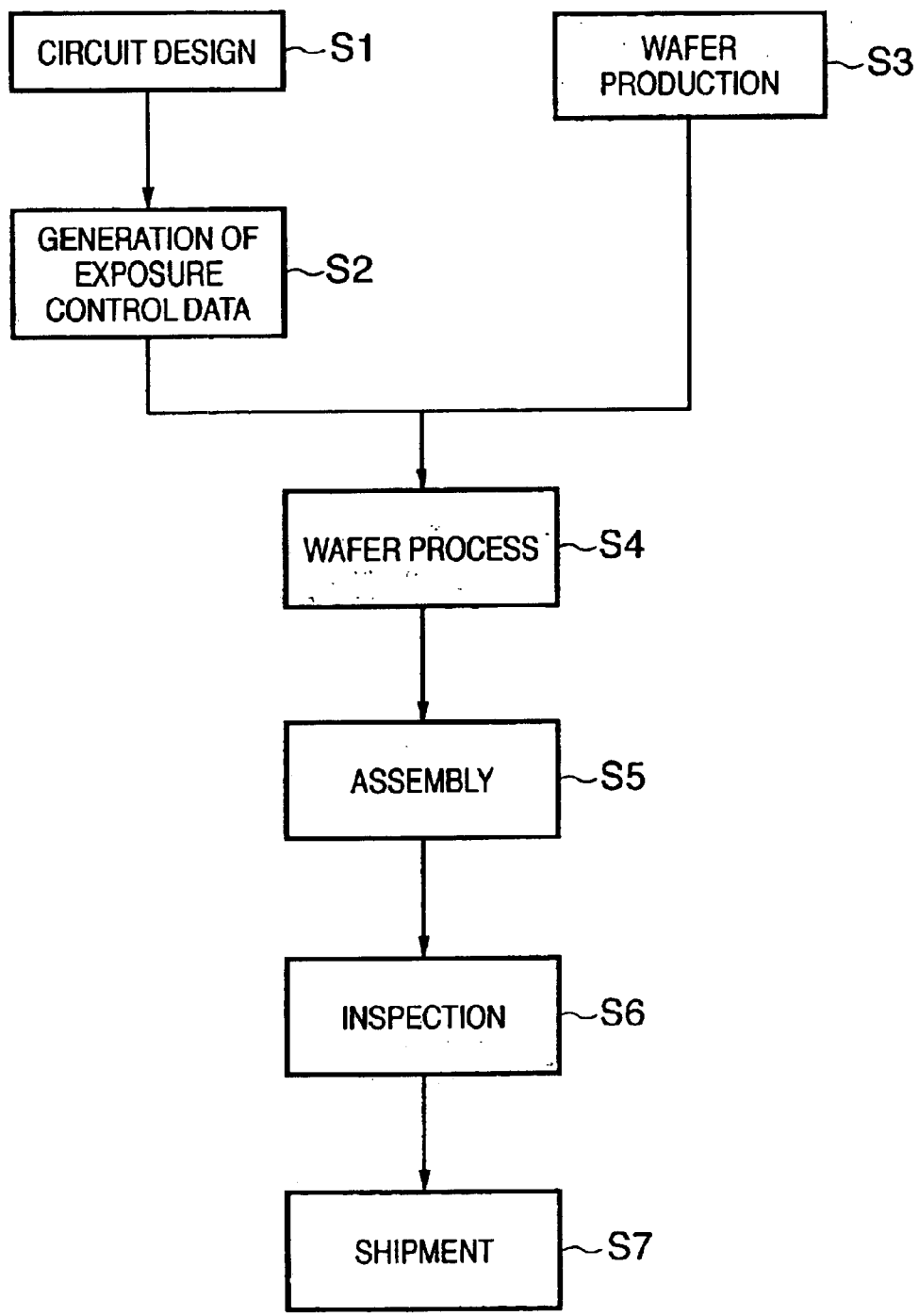
FIG. 28 is a block diagram explaining a flow of a device manufacturing process.

Next described is a semiconductor device manufacturing process employing the above-described charged particle beam exposure apparatus. FIG. 28 shows a flow of an overall manufacturing process of a semiconductor device.

In step 1 (circuit design), a circuit of a semiconductor device is designed. In step 2 (generation of exposure control data), exposure control data of the exposure apparatus is generated based on the designed circuit pattern. Meanwhile, in step 3 (wafer production), a wafer is produced with a material such as silicon. In step 4 (wafer process), which is called a pre-process, an actual circuit is formed on the wafer by a lithography technique. In step 5 (assembly), which is called a post-process, a semiconductor chip is manufactured using the wafer produced in step 4. Step 5 includes an assembling process (dicing, bonding), a packaging process (chip embedding) and so on. In step 6 (inspection), the semiconductor device manufactured in step 5 is subjected to inspection such as an operation-check test, durability test and so on. Semiconductor devices are manufactured in the foregoing processes and shipped (step 7).

Figure 29:
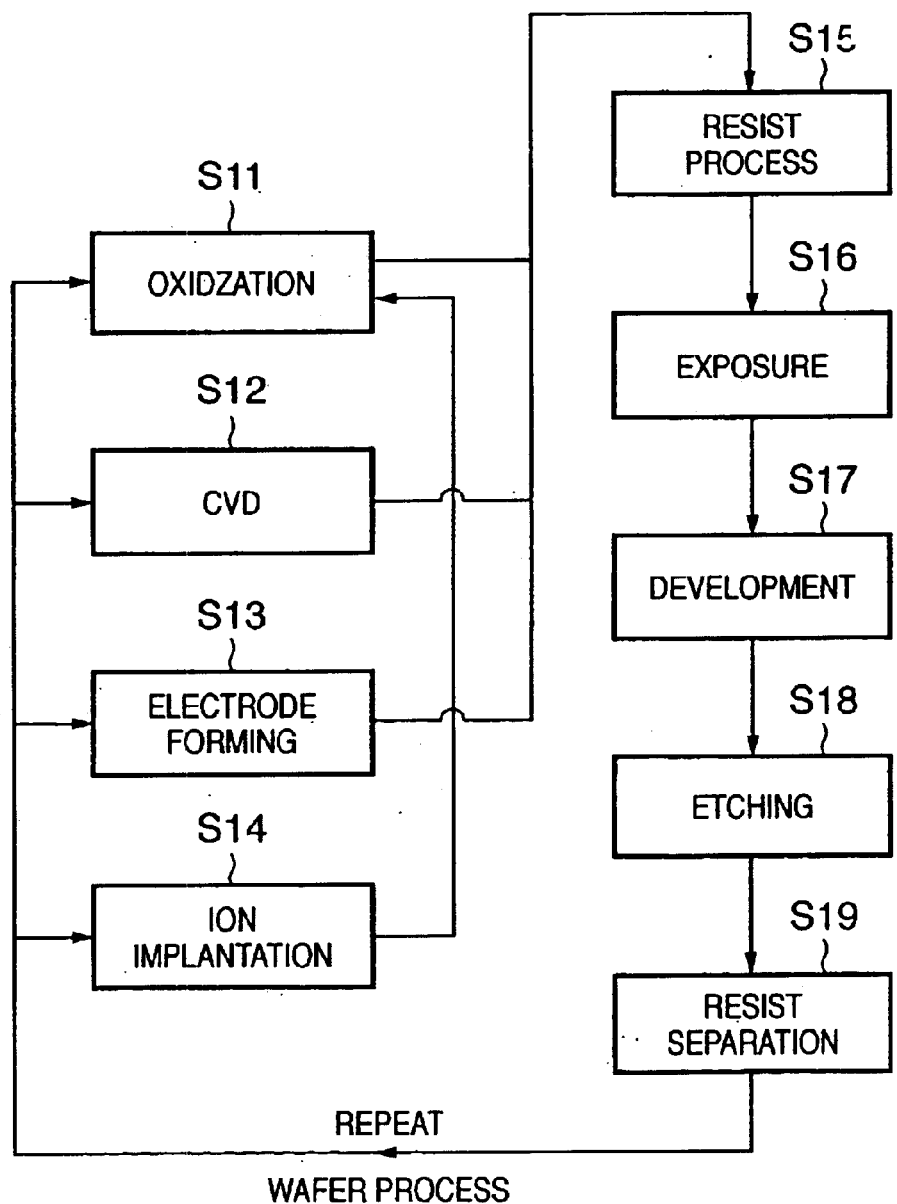
FIG. 29 is a block diagram explaining a flow of a device manufacturing process.

FIG. 29 shows a flow of the aforementioned wafer process in detail. In step 11 (oxidization), the wafer surface is oxidized. In step 12 (CVD), an insulating film is deposited on the wafer surface. In step 13 (electrode forming), electrodes are deposited on the wafer. In step 14 (ion implantation), ion is implanted on the wafer. In step 15 (resist process), a photosensitive agent is coated on the wafer. In step 16 (exposure), the circuit pattern is rendered (exposed) on the wafer by the above-described charged particle beam exposure apparatus. In step 17 (development), the exposed wafer is developed. In step 18 (etching), portions other than the developed resist image are removed. In step 19 (resist separation), unnecessary resist after the etching process is removed. By repeating the foregoing steps, multiple circuit patterns are formed on the wafer.

As many apparently widely different embodiments of the present invention can be made without departing from the spirit and scope thereof, it is to be understood that the invention is not limited to the specific embodiments thereof except as defined in the appended claims.

What is claimed is:

1. A deflector comprising:
   an electrode substrate having a plurality of through holes, and an electrode pair made up of first and second electrodes which oppose side walls of each through hole in order to control a locus of a charged particle beam passing through the through hole; and
   a wiring substrate having connection wiring pads connected to said electrode pairs of said electrode substrate to individually apply a voltage to said electrode pairs,
   wherein said electrode substrate and wiring substrate are bonded via said connection wiring pads of said wiring substrate.

2. The deflector according to claim 1, wherein regions of said wiring substrate, which correspond to the through holes of said electrode substrate have neither connection wiring pads nor interconnections connected to the connection wiring pads.

3. The deflector according to claim 1, wherein said wiring substrate is a multilayered wiring substrate.

4. The deflector according to claim 1, wherein a grounded shield electrode is formed on a surface of said electrode substrate which opposes a surface bonded to said wiring substrate.

5. The deflector according to claim 1, wherein the bonding is Au—Sn eutectic bonding.

6. The deflector according to claim 1, wherein the bonding is Au—Au cold bonding.

7. The deflector according to claim 1, wherein one group of said connection wiring pads are connected to a common interconnection for electrical grounding, and the other group of said connection wiring pads are connected in one-to-one correspondence with interconnections for voltage application.

8. The deflector according to claim 7, further comprising a shield substrate having a conductive layer,
   wherein said shield substrate comprises:
   holes formed in positions corresponding to the through holes, and having side walls formed by said conductive layer; and
   a pad for connecting to said electrode substrate, and
   said shield substrate is electrically grounded by the connection of said pad.

9. The deflector according to claim 1,
   wherein said wiring substrate comprises:
   holes extending through said wiring substrate in positions corresponding to the through holes formed in said electrode substrate; and
   an electrode electrically connected to side surfaces of the holes, a wiring layer surface at the holes, and a rear surface of said wiring substrate.

10. The deflector according to claim 1, wherein an electrically grounded electrode is formed on a surface and a rear surface of said electrode substrate.

11. A deflector comprising:
    an electrode substrate having a plurality of through holes, an electrode pair made up of first and second electrodes which oppose side walls of each through hole in order to control a locus of a charged particle beam passing through the through hole, and electrode wiring pads formed near said first and second electrodes and electrically connected to said first and second electrodes; and
    a wiring substrate having connection wiring pads connected to said electrode wiring pads of said electrode substrate to individually apply a voltage to said electrode pairs,
    wherein said electrode substrate and wiring substrate are bonded via said connection wiring pads of said wiring substrate and said electrode wiring pads of said electrode substrate.

12. The deflector according to claim 11, wherein regions of said wiring substrate, which correspond to the through holes of said electrode substrate have neither connection wiring pads nor interconnections connected to the connection wiring pads.

13. The deflector according to claim 11, wherein said wiring substrate is a multilayered wiring substrate.

14. A method of manufacturing a deflector by bonding an electrode substrate and wiring substrate, comprising steps of:
    preparing an electrode substrate having a plurality of through holes, and an electrode pair made up of first and second electrodes which oppose side walls of each through hole in order to control a locus of a charged particle beam passing through the through hole;

preparing a wiring substrate having connection wiring pads to be connected to the electrode pairs of the electrode substrate to individually apply a voltage to the electrode pairs; and forming a beam aperture in a wiring layer of the wiring substrate before the electrode substrate and wiring substrate are bonded.

15. A method of manufacturing a deflector by bonding an electrode substrate and wiring substrate, comprising steps of:

preparing an electrode substrate having a plurality of through holes, an electrode pair made up of first and second electrodes which oppose side walls of each through hole in order to control a locus of a charged particle beam passing through the through hole, and electrode wiring pads formed near said first and second electrodes and electrically connected to said first and second electrodes;

preparing a wiring substrate having connection wiring pads to be connected to the electrode wiring pads of said electrode substrate to individually apply a voltage to said electrode pairs; and forming a beam aperture in a wiring layer of the wiring substrate before the electrode substrate and wiring substrate are bonded.

16. A charged particle beam exposure apparatus comprising:

a charged particle source for emitting a charged particle beam; and a deflector for controlling an image formation position of the emitted charged particle beam, wherein said deflector comprises:

an electrode substrate having a plurality of through holes, and an electrode pair made up of first and second electrodes which oppose side walls of each through hole in order to control a locus of a charged particle beam passing through the through hole; and a wiring substrate having connection wiring pads connected to said electrode pairs of said electrode substrate to individually apply voltages to said electrode pairs, and said deflector is formed by bonding said electrode substrate and wiring substrate via said connection wiring pads of said wiring substrate.

17. A charged particle beam exposure apparatus comprising:

a charged particle source for emitting a charged particle beam; and a deflector for controlling an image formation position of the emitted charged particle beam, wherein said deflector comprises:

an electrode substrate having a plurality of through holes, an electrode pair made up of first and second electrodes which oppose side walls of each through hole in order to control a locus of a charged particle beam passing through the through hole, and electrode wiring pads formed near said first and second electrodes and electrically connected to said first and second electrodes; and a wiring substrate having connection wiring pads connected to said electrode wiring pads of said electrode substrate to individually apply voltages to said electrode pairs, and said deflector is formed by bonding said electrode substrate and wiring substrate via said connection wiring pads of said wiring substrate and said electrode wiring pads of said electrode substrate.

18. A method of manufacturing a deflector by bonding an electrode substrate and wiring substrate, comprising steps of:

preparing an electrode substrate having a plurality of through holes, and an electrode pair made up of first and second electrodes which oppose side walls of each through hole in order to control a locus of a charged particle beam passing through the through hole; and preparing a wiring substrate to be bonded to the electrode substrate, wherein in the wiring substrate preparation step, the wiring substrate comprises:

holes extending through the wiring substrate in positions corresponding to the through holes formed in the electrode substrate; and an electrode electrically connected to side surfaces of the holes, a wiring layer surface at the holes, and a rear surface of the wiring substrate.

19. A deflector comprising:

an electrode substrate having a plurality of openings, and a plurality of electrode pairs each made up of first and second electrodes which oppose through a corresponding one of the openings in order to deflect a charged particle beam passing through the corresponding opening; and a wiring substrate obtained by stacking a first wiring layer having a first interconnection for applying a first voltage to said first electrode and a second wiring layer having a second interconnection for applying a second voltage to said second electrode.

20. A deflector comprising:

an electrode substrate having a plurality of openings, and a plurality of electrode pairs each made up of first and second electrodes which oppose through a corresponding one of the openings in order to deflect a charged particle beam passing through the corresponding opening;

a first wiring substrate having a first interconnection for applying a first voltage to said first substrate; and a second wiring substrate having a second interconnection for applying a second voltage to said second electrode, wherein said electrode substrate is arranged between said first and second wiring substrates.

21. A deflector comprising:

an electrode substrate having a plurality of openings, and a plurality of electrode pairs each made up of first and second electrodes which oppose through a corresponding one of the openings in order to deflect a charged particle beam passing through the corresponding opening;

a wiring substrate having an interconnection for applying a predetermined voltage to said first electrode; and a ground substrate which applies a ground voltage to said second electrode, wherein said ground substrate is arranged in front of said electrode substrate and said wiring substrate with respect to a passing direction of the charged particle beam.

22. A charged particle beam exposure apparatus comprising a charged particle beam source and a deflector which deflects a charged particle beam emitted from said charged particle beam source, said deflector including:

an electrode substrate having a plurality of openings, and a plurality of electrode pairs each made up of first and second electrodes which oppose through a corresponding one of the openings in order to deflect a charged particle beam passing through the corresponding opening; and a wiring substrate obtained by stacking a first wiring layer having a first interconnection for applying a first voltage to said first electrode and a second wiring layer having a second interconnection for applying a second voltage to said second electrode.

23. A device manufacturing method comprising steps of:

exposing a wafer using a charged particle beam exposure apparatus cited in claim 22; and developing the wafer.

24. A charged particle beam exposure apparatus comprising a charged particle beam source and a deflector which deflects a charged particle beam emitted from said charged particle beam source, said deflector including:

an electrode substrate having a plurality of openings, and a plurality of electrode pairs each made up of first and second electrodes which oppose through a corresponding one of the openings in order to deflect a charged particle beam passing through the corresponding opening;

a first wiring substrate having a first interconnection for applying a first voltage to said first substrate; and a second wiring substrate having a second interconnection for applying a second voltage to said second electrode, wherein said electrode substrate is arranged between said first and second wiring substrates.

25. A charged particle beam exposure apparatus comprising a charged particle beam source and a deflector which deflects a charged particle beam emitted from said charged particle beam source, said deflector including:

an electrode substrate having a plurality of openings, and a plurality of electrode pairs each made up of first and second electrodes which oppose through a corresponding one of the openings in order to deflect a charged particle beam passing through the corresponding opening;

a wiring substrate having an interconnection for applying a predetermined voltage to said first electrode; and a ground substrate which applies a ground voltage to said second electrode, wherein said ground substrate is arranged nearer to said charged particle beam source than said electrode substrate and said wiring substrate.

* * * * *

UNITED STATES PATENT AND TRADEMARK OFFICE
CERTIFICATE OF CORRECTION

PATENT NO.       : 7,109,494 B2                                    Page 1 of 1
APPLICATION NO.  : 10/787082
DATED            : September 19, 2006
INVENTOR(S)      : Haruhito Ono et al.

It is certified that error appears in the above-identified patent and that said Letters Patent is hereby corrected as shown below:

ON THE COVER PAGE:
   In item "(75)   Inventors:" the last-listed inventor "Yoshinori Nakayama, Tokyo (JP)" should read -- Yoshinori Nakayama, Sayama (JP) --.

COLUMN 6:
   Line 57, "Fig." should be deleted.

COLUMN 11:
   Line 37, "the, electrode" should read -- the electrode --.

Signed and Sealed this

Third Day of April, 2007

JON W. DUDAS
*Director of the United States Patent and Trademark Office*